(12) United States Patent
Sasaki et al.

(10) Patent No.: US 8,355,299 B2
(45) Date of Patent: Jan. 15, 2013

(54) HEAT-ASSISTED MAGNETIC RECORDING HEAD WITH CONVERGENT LENS

(75) Inventors: Yoshitaka Sasaki, Milpitas, CA (US);
Hiroyuki Ito, Milpitas, CA (US);
Shigeki Tanemura, Milpitas, CA (US);
Hironori Araki, Milpitas, CA (US);
Kazuo Ishizaki, Milpitas, CA (US)

(73) Assignee: Headway Technologies, Inc., Mipitas, CA (US)

( * ) Notice: Subject to any disclaimer, the term of this patent is extended or adjusted under 35 U.S.C. 154(b) by 394 days.

(21) Appl. No.: 12/696,554

(22) Filed: Jan. 29, 2010

(65) Prior Publication Data
US 2011/0188354 A1 Aug. 4, 2011

(51) Int. Cl.
*G11B 11/00* (2006.01)
(52) U.S. Cl. .............. 369/13.33; 369/13.13; 29/603.07
(58) Field of Classification Search ............... 369/13.33, 369/13.13, 13.02, 13.32, 14, 15, 112.09, 369/112.14, 112.21, 112.27, 300; 360/59; 385/129, 31, 88–94; 29/603.01–603.27; 250/201.3, 201.5
See application file for complete search history.

(56) References Cited

U.S. PATENT DOCUMENTS

| | | | |
|---|---|---|---|
| 6,994,808 B2 | 2/2006 | Lee et al. | |
| 7,133,230 B2 | 11/2006 | Saga et al. | |
| 7,359,599 B2 | 4/2008 | Matsumoto | |
| 7,529,158 B2 | 5/2009 | Matsumoto et al. | |
| 7,933,169 B2 | 4/2011 | Matsumoto et al. | |
| 8,023,228 B2 | 9/2011 | Sohn et al. | |
| 8,050,170 B2 * | 11/2011 | Park et al. | 369/112.23 |
| 8,116,034 B2 | 2/2012 | Komura et al. | |
| 8,184,506 B2 * | 5/2012 | Hirata et al. | 369/13.33 |
| 2006/0076697 A1 | 4/2006 | Lee et al. | |
| 2006/0233062 A1 | 10/2006 | Bedillion et al. | |
| 2007/0165494 A1 | 7/2007 | Cho et al. | |
| 2008/0002298 A1 | 1/2008 | Sluzewski | |
| 2008/0055762 A1 | 3/2008 | Shimazawa et al. | |
| 2011/0026377 A1 * | 2/2011 | Shimazawa et al. | 369/13.24 |
| 2011/0122737 A1 * | 5/2011 | Shimazawa et al. | 369/13.24 |

FOREIGN PATENT DOCUMENTS

| | | |
|---|---|---|
| JP | A-2004-151046 | 5/2004 |
| JP | A-2004-158067 | 6/2004 |
| JP | A-2004-163960 | 6/2004 |
| JP | A-2007-188619 | 7/2007 |
| JP | A-2007-280572 | 10/2007 |
| JP | A-2009-15957 | 1/2009 |
| JP | A-2009-163806 | 7/2009 |
| JP | A-2011-34661 | 2/2011 |
| WO | WO 2009/147725 A1 | 12/2009 |

OTHER PUBLICATIONS

Japanese Office Action issued in Japanese Patent Application No. 2010-183549 dated Apr. 2, 2012 (w/ Translation).
Dec. 27, 2011 Office Action issued in Japanese Patent Application No. 2010-183549 (with English-language translation).

* cited by examiner

*Primary Examiner* — Tan X Dinh
(74) *Attorney, Agent, or Firm* — Oliff & Berridge, PLC

(57) ABSTRACT

A heat-assisted magnetic recording head includes a magnetic pole, a waveguide that allows light to propagate therethrough, a near-field light generating element that generates near-field light based on the light propagating through the waveguide, a convergent lens, and a laser diode disposed above the waveguide. The convergent lens transmits light that is emitted from the laser diode, so that the light transmitted through the convergent lens is incident on the waveguide.

20 Claims, 25 Drawing Sheets

HEAT-ASSISTED MAGNETIC RECORDING HEAD WITH CONVERGENT LENS

BACKGROUND OF THE INVENTION

1. Field of the Invention

The present invention relates to a heat-assisted magnetic recording head for use in heat-assisted magnetic recording where a recording medium is irradiated with near-fiel a recording.

2. Description of the Related Art

Recently, magnetic recording devices such as magnetic disk drives have been improved in recording density, and thin-film magnetic heads and magnetic recording media of improved performance have been demanded accordingly. Among the thin-film magnetic heads, a composite thin-film magnetic head has been used widely. The composite thin-film magnetic head has such a structure that a reproducing head including a magnetoresistive element (hereinafter, also referred to as MR element) for reading and a recording head including an induction-type electromagnetic transducer for writing are stacked on a substrate. In a magnetic disk drive, the thin-film magnetic head is mounted on a slider which flies slightly above the surface of the magnetic recording medium.

To increase the recording density of a magnetic recording device, it is effective to make the magnetic fine particles of the recording medium smaller. Making the magnetic fine particles smaller, however, causes the problem that the magnetic fine particles drop in the thermal stability of magnetization. To solve this problem, it is effective to increase the anisotropic energy of the magnetic fine particles. However, increasing the anisotropic energy of the magnetic fine particles leads to an increase in coercivity of the recording medium, and this makes it difficult to perform data recording with existing magnetic heads.

To solve the foregoing problems, there has been proposed a technique so-called heat-assisted magnetic recording. This technique uses a recording medium having high coercivity. When recording data, a magnetic field and heat are simultaneously applied to the area of the recording medium where to record data, so that the area rises in temperature and drops in coercivity for data recording. The area where data is recorded subsequently falls in temperature and rises in coercivity to increase the thermal stability of magnetization.

In heat-assisted magnetic recording, near-field light is typically used as a means for applying heat to the recording medium. A known method for generating near-field light is to irradiate a plasmon antenna, which is a small piece of metal, with laser light. The plasmon antenna has a near-field light generating part which is a sharp-pointed part for generating near-field light. The laser light applied to the plasmon antenna excites surface plasmons on the plasmon antenna. The surface plasmons propagate to the near-field light generating part of the plasmon antenna, and the near-field light generating part generates near-field light based on the surface plasmons. The near-field light generated by the plasmon antenna exists only within an area smaller than the diffraction limit of light. Irradiating the recording medium with the near-field light makes it possible to heat only a small area of the recording medium.

In general, the laser light to be used for generating the near-field light is guided through a waveguide that is provided in the slider to the plasmon antenna that is located near the medium facing surface of the slider. Possible techniques of placement of a light source that emits the laser light are broadly classified into the following two. A first technique is to place the light source away from the slider. A second technique is to fix the light source to the slider.

The first technique is described in U.S. Patent Application Publication No. 2006/0233062 A1, for example. The second technique is described in U.S. Patent Application Publication No. 2008/0055762 A1 and U.S. Patent Application Publication No. 2008/0002298 A1, for example.

The first technique requires an optical path of extended length including such optical elements as a mirror, lens, and optical fiber in order to guide the light from the light source to the waveguide. This causes the problem of increasing energy loss of the light in the path. The second technique is free from the foregoing problem since the optical path for guiding the light from the light source to the wave guide is short.

The second technique, however, has the following problem. Hereinafter, the problem that can occur with the second technique will be described in detail. The second technique typically uses a laser diode as the light source. The laser light emitted from a laser diode can be made incident on the waveguide by a technique described in U.S. Patent Application Publication No. 2008/0055762 A1, for example. This publication describes arranging an edge-emitting laser diode with its emission part opposed to the incident end of the waveguide so that the laser light emitted from the emission part is incident on the incident end of the waveguide without the intervention of any optical element. According to this technique, the laser diode is arranged so that the longitudinal direction of the laser diode, i.e., the direction of the optical axis of the laser light to be emitted from the emission part, is perpendicular to the end face of the slider where the incident end of the waveguide is located. In such a case, the laser diode needs to be positioned with high precision so that the optical axis of the laser light emitted from the emission part will not tilt with respect to the optical axis of the waveguide. If the optical axis of the laser light emitted from the emission part tilts with respect to the optical axis of the waveguide, the laser light may fail to be delivered to the plasmon antenna with sufficient intensity. When the laser diode is to be arranged so that the longitudinal direction of the laser diode is perpendicular to the end face of the slider where the incident end of the waveguide is located, however, there is a problem that the longitudinal direction of the laser diode can easily tilt with respect to the direction perpendicular to the end face of the slider where the incident end of the waveguide is located, and it is thus difficult to align the laser light with the waveguide.

The laser light emitted from a laser diode may be made incident on the waveguide by other techniques. For example, as described in U.S. Patent Application Publication No. 2008/0002298 A1, the laser diode may be disposed with its emission part facing the surface of the slider on the trailing side so that the laser light emitted from the emission part is incident on the waveguide from above. This technique facilitates the alignment of the laser light with the waveguide.

Disposing the laser diode on the trailing side of the slider facilitates the alignment of the laser light with the waveguide, as mentioned above. In this case, however, there arises the following problem. Disposing the laser diode on the trailing side of the slider increases the distance from the emission part of the laser diode to the waveguide as compared with the case where the laser diode is disposed with its emission part facing the incident end of the waveguide. Laser light emitted from the emission part of the laser diode increases in diameter with increasing distance from the emission part. Accordingly, if the laser diode is disposed on the trailing side of the slider, part of the laser light fails to be incident on the waveguide due to the increased distance from the emission part of the laser diode to the waveguide. This causes a drop in the amount of the laser light that propagates through the waveguide, thereby reducing the use efficiency of the laser light to be used for generating near-field light.

OBJECT AND SUMMARY OF THE INVENTION

It is an object of the present invention to provide a heat-assisted magnetic recording head that facilitates the alignment of incident light with a waveguide and allows eliminating the problems that result from an increased distance from the light source to the waveguide, and a method of manufacturing such a heat-assisted magnetic recording head.

A heat-assisted magnetic recording head of the present invention includes: a medium facing surface that faces a recording medium; a magnetic pole that has an end face located in the medium facing surface and produces a recording magnetic field for recording data on the recording medium; a waveguide that allows light to propagate therethrough; a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon; a convergent lens; and a substrate having a top surface.

In the heat-assisted magnetic recording head of the present invention, the magnetic pole, the waveguide, the near-field light generating element, and the convergent lens are disposed above the top surface of the substrate. The convergent lens transmits light that is emitted from a light source disposed above the waveguide, so that the light transmitted through the convergent lens is incident on the waveguide.

The heat-assisted magnetic recording head of the present invention may further include a support layer that is made of a dielectric material and supports the convergent lens. In such a case, the support layer may have a groove that accommodates at least a part of the convergent lens. The groove may have a bottom that forms a concave curved surface. The convergent lens may have a bottom surface that forms a convex curved surface in contact with the bottom of the groove. The convergent lens may have a refractive index higher than that of the support layer.

In the heat-assisted magnetic recording head of the present invention, the convergent lens may have a top surface that forms a convex curved surface.

The heat-assisted magnetic recording head of the present invention may further include an internal mirror that reflects the light transmitted through the convergent lens so that the reflected light travels through the waveguide toward the medium facing surface.

The heat-assisted magnetic recording head of the present invention may further include a laser diode as the light source. In this case, the laser diode may be of edge-emitting type. The heat-assisted magnetic recording head of the present invention may further include an external mirror that reflects the light emitted from the laser diode so that the reflected light is incident on the convergent lens. Alternatively, the laser diode may be of surface-emitting type.

In the heat-assisted magnetic recording head of the present invention, the convergent lens may be made of $Ta_2O_5$ or a polyimide resin.

In the heat-assisted magnetic recording head of the present invention, the near-field light generating element may have an outer surface that includes: a first end face that is located in the medium facing surface; a second end face that is farther from the medium facing surface; and a coupling portion that couples the first end face and the second end face to each other. The first end face may include the near-field light generating part. In this case, a length of the near-field light generating element in a direction perpendicular to the medium facing surface may be greater than a length of the first end face in a direction perpendicular to the top surface of the substrate. The waveguide may have an outer surface including an opposed portion that is opposed to a part of the coupling portion.

A method of manufacturing the heat-assisted magnetic recording head of the present invention includes the steps of forming the magnetic pole; forming the waveguide; forming the near-field light generating element; and forming the convergent lens.

The method of manufacturing the heat-assisted magnetic recording head of the present invention may further include the step of forming a support layer before the step of forming the convergent lens, the support layer being made of a dielectric material and supporting the convergent lens. The support layer may have a groove that accommodates at least a part of the convergent lens. The groove may have a bottom that forms a concave curved surface. The convergent lens may have a bottom surface that forms a convex curved surface in contact with the bottom of the groove. The convergent lens may have a refractive index higher than that of the support layer.

In the method of manufacturing the heat-assisted magnetic recording head of the present invention, the convergent lens may have a top surface that forms a convex curved surface.

In the case where the method of manufacturing the heat-assisted magnetic recording head of the present invention includes the step of forming the support layer, the step of forming the convergent lens may include the steps of: forming a mask on the support layer, the mask having an opening that has a shape corresponding to a planar shape of the convergent lens to be formed later; forming a dielectric layer over the support layer and the mask with the mask intact; and removing the mask and a portion of the dielectric layer formed on the mask, so that a portion of the dielectric layer formed on the support layer becomes the convergent lens.

In the case where the support layer has a groove that accommodates at least a part of the convergent lens, the step of forming the support layer may include the steps of: forming an initial support layer that is intended to undergo the formation of the groove therein later to thereby become the support layer; forming a mask on the initial support layer, the mask having an opening that has a shape corresponding to a planar shape of the convergent lens to be formed later; and forming the groove in the initial support layer by etching a portion of a top surface of the initial support layer that is exposed from the opening of the mask, so that the initial support layer becomes the support layer. Here, the step of forming the convergent lens may include the steps of forming a dielectric layer over the groove and the mask with the mask intact; and removing the mask and a portion of the dielectric layer formed on the mask, so that a portion of the dielectric layer formed on the groove becomes the convergent lens. In such a case, the groove may have a bottom that forms a concave curved surface. The convergent lens may have a bottom surface that forms a convex curved surface in contact with the bottom of the groove, and the convergent lens may have a refractive index higher than that of the support layer.

In the case where the support layer has a groove that accommodates at least a part of the convergent lens, the step of forming the convergent lens may include the steps of forming a thermoplastic resin layer on the groove of the support layer, the thermoplastic resin layer being intended to become the convergent lens later; and heating the thermoplastic resin layer so that the thermoplastic resin layer melts and thereafter solidifies to become the convergent lens. In such a case, the groove may have a bottom that forms a concave curved surface. The convergent lens may have a bottom surface that forms a convex curved surface in contact with the bottom of the groove, and the convergent lens may have a refractive index higher than that of the support layer. Moreover, the convergent lens may have a top surface that forms a convex curved surface. In the step of heating the thermoplastic resin layer, the thermoplastic resin layer may be melted so that a surface of the thermoplastic resin layer is shaped into a smooth curved surface by surface tension, whereby the top surface of the convergent lens is formed. The thermoplastic resin layer may be made of a polyimide resin.

Where the components of the heat-assisted magnetic recording head excluding the substrate are concerned in the present application, a surface closer to the top surface of the substrate will be defined as "bottom surface," and a surface farther from the top surface of the substrate will be defined as "top surface."

According to the heat-assisted magnetic recording head and the method of manufacturing the same of the present invention, the magnetic pole, the waveguide, the near-field light generating element, and the convergent lens are disposed above the top surface of the substrate. The convergent lens transmits light that is emitted from the light source disposed above the waveguide, so that the light transmitted through the convergent lens is incident on the waveguide. In the present invention, the light incident on the waveguide has a diameter smaller than that of the light that would be incident on the waveguide without the convergent lens. Consequently, according to the present invention, it is possible to align the incident light with the waveguide easily and to solve the problem that is ascribable to an increased distance from the light source to the waveguide.

In the present invention, the light transmitted through the convergent lens may be converging light, a parallel beam, or diverging light that diverges less widely than in the case where there is no convergent lens.

The heat-assisted magnetic recording head of the present invention may include a support layer that supports the convergent lens. The support layer may have a groove that accommodates at least a part of the convergent lens. The groove may have a bottom that forms a concave curved surface. The convergent lens may have a bottom surface that forms a convex curved surface in contact with the bottom of the groove, and may have a refractive index higher than that of the support layer. In such a case, the convergent lens exerts the function of converging the light at its bottom surface.

Other and further objects, features and advantages of the present invention will appear more fully from the following description.

DETAILED DESCRIPTION OF THE PREFERRED EMBODIMENTS

[First Embodiment]

Figure 1:
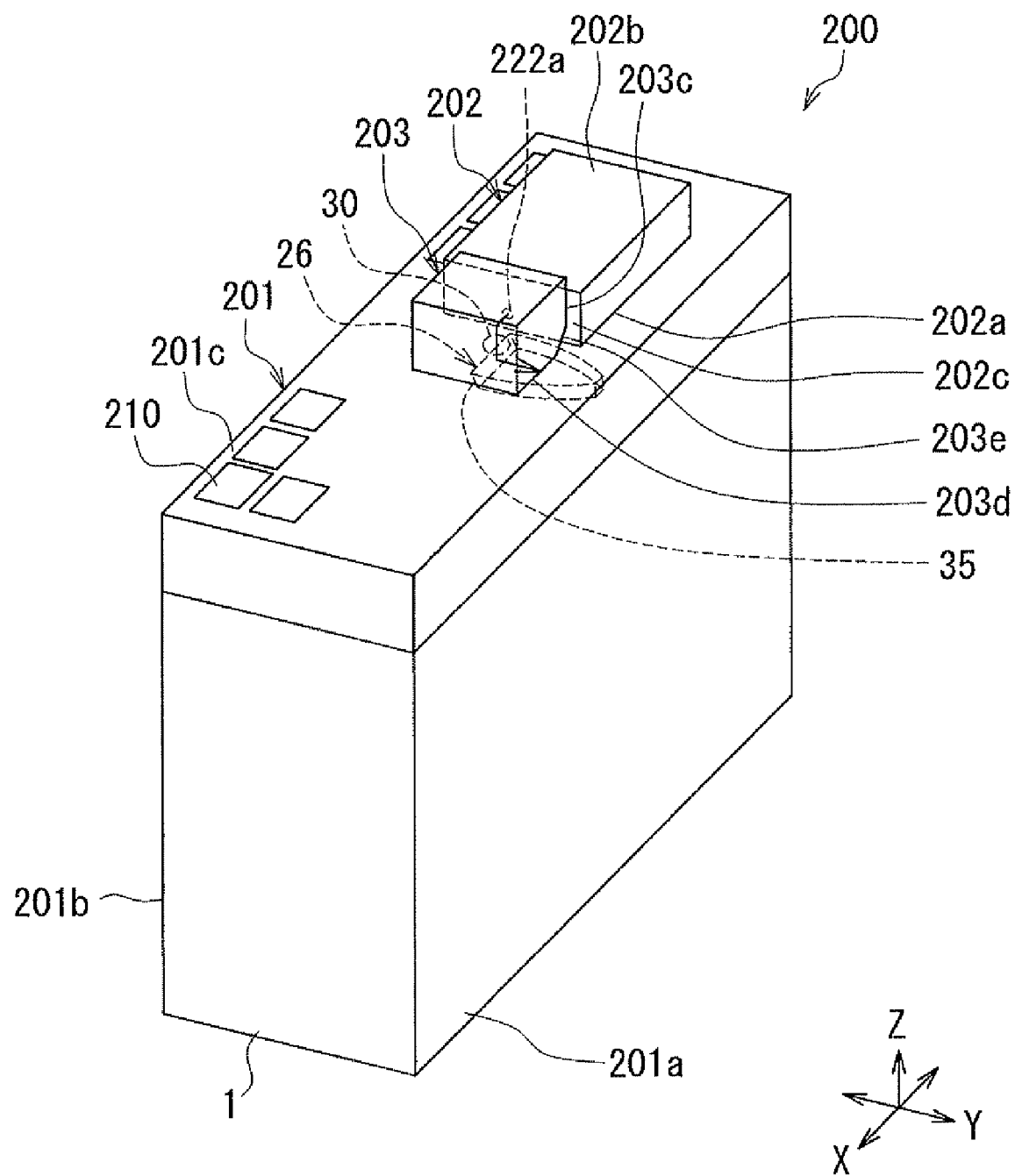
FIG. 1 is a perspective view of a heat-assisted magnetic recording head according to a first embodiment of the invention.

Preferred embodiments of the present invention will now be described in detail with reference to the drawings. Reference is first made to FIG. 1 to describe a heat-assisted magnetic recording head and a magnetic disk drive according to a first embodiment of the invention. FIG. 1 is a perspective view of the heat-assisted magnetic recording head according to the present embodiment.

The magnetic disk drive of the present embodiment incorporates the heat-assisted magnetic recording head 200 according to the present embodiment. The heat-assisted magnetic recording head 200 is supported by a not-shown suspension and is disposed to face a circular-plate-shaped recording medium (magnetic disk) that is driven to rotate. In FIG. 1, the X direction is a direction across the tracks of the recording medium, the Y direction is a direction perpendicular to the surface of the recording medium, and the Z direction is the direction of travel of the recording medium as viewed from the heat-assisted magnetic recording head 200. The X direction, the Y direction and the Z direction are orthogonal to one another.

The heat-assisted magnetic recording head 200 includes a slider 201, an edge-emitting laser diode 202 fixed to the slider 201, and an external mirror 203 provided outside the slider 201. The slider 201 is nearly hexahedron-shaped, and has a medium facing surface 201a that faces the recording medium, a rear surface 201b opposite to the medium facing surface 201a, and four surfaces that couple the medium facing surface 201a to the rear surface 201b. The medium facing surface 201a of the slider 201 also functions as the medium facing surface of the heat-assisted magnetic recording head 200. One of the four surfaces that couple the medium facing surface 201a to the rear surface 201b is a top surface 201c. The laser diode 202 is fixed to the top surface 201c. The slider 201 has a plurality of terminals 210 provided on the top surface 201c. In the present embodiment, the external mirror 203 is fixed to the laser diode 202.

When the recording medium rotates and travels in the Z direction, an airflow passing between the recording medium and the slider 201 generates a lift in the Y direction of FIG. 1, and the lift is exerted on the slider 201. The lift causes the slider 201 to fly over the surface of the recording medium.

Figure 4:
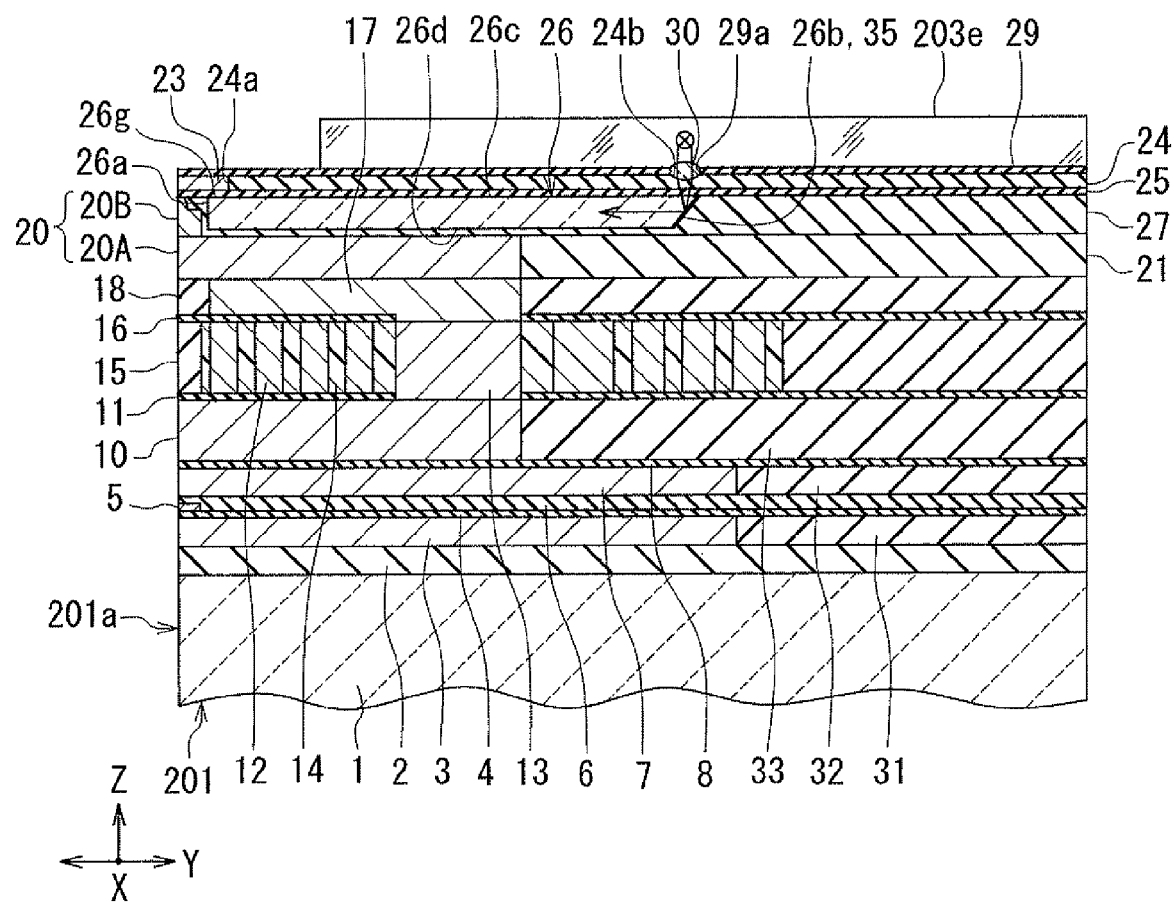
FIG. 4 is a cross-sectional view showing the configuration of a slider of the first embodiment of the invention.
Figure 5:
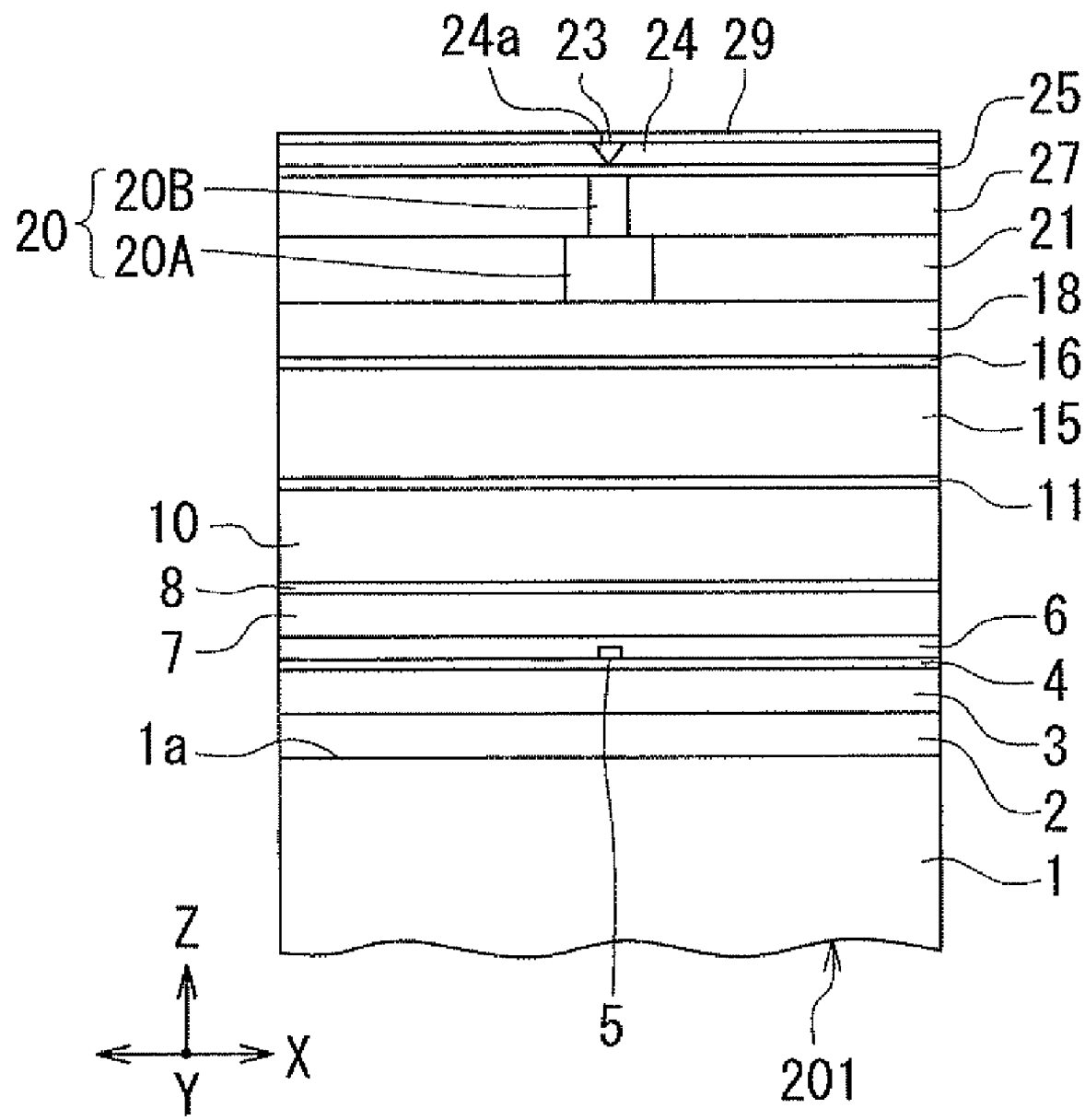
FIG. 5 is a front view showing the medium facing surface of the slider of the first embodiment of the invention.
Figure 6:
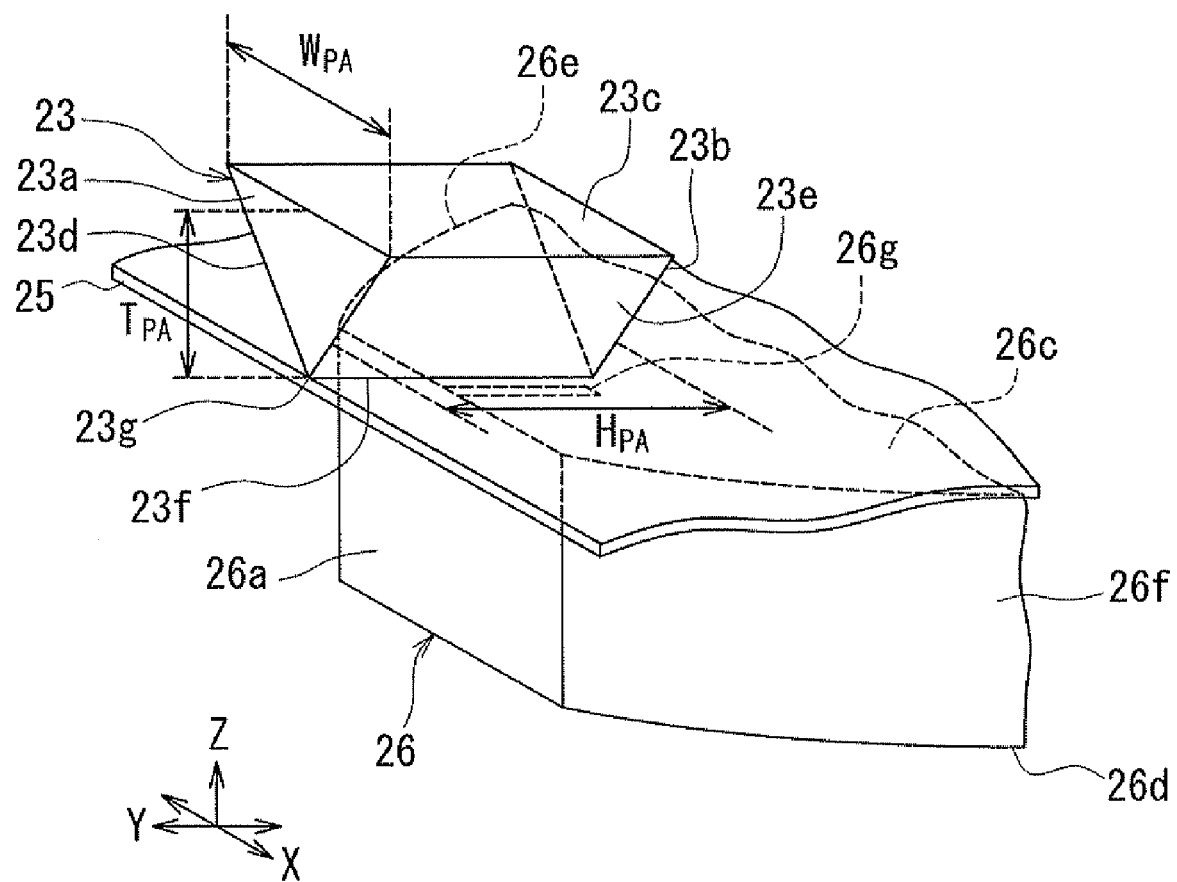
FIG. 6 is a perspective view showing a near-field light generating element and its vicinity in the heat-assisted magnetic recording head according to the first embodiment of the invention.

Reference is now made to FIG. 4 to FIG. 6 to describe the configuration of the slider 201 in detail. FIG. 4 is a cross-sectional view showing the configuration of the slider 201. FIG. 5 is a front view showing the medium facing surface 201a of the slider 201. FIG. 6 is a perspective view showing a near-field light generating element and its vicinity in the heat-assisted magnetic recording head 200. The X, Y and Z directions shown in FIG. 1 are also shown in FIG. 4 to FIG. 6. In FIG. 4, the X direction is orthogonal to the Y and Z directions. In FIG. 5, the Y direction is orthogonal to the X and Z directions.

As shown in FIG. 4 and FIG. 5, the slider 201 includes: a substrate 1 made of a ceramic material such as aluminum oxide-titanium carbide ($Al_2O_3$—TiC) and having a top surface 1a; an insulating layer 2 made of an insulating material and disposed on the top surface 1a of the substrate 1; a bottom shield layer 3 made of a magnetic material and disposed on the insulating layer 2; and an insulating layer 31 made of an insulating material and disposed around the bottom shield layer 3 on the insulating layer 2. The insulating layers 2 and 31 are made of alumina ($Al_2O_3$), for example. The bottom shield layer 3 and the insulating layer 31 are flattened at the top.

The slider 201 further includes: a bottom shield gap film 4 which is an insulating film disposed over the top surfaces of the bottom shield layer 3 and the insulating layer 31; a magnetoresistive (MR) element 5 as a reproducing element disposed on the bottom shield gap film 4; a top shield gap film 6 which is an insulating film disposed on the MR element 5; a top shield layer 7 made of a magnetic material and disposed on the top shield gap film 6; and an insulating layer 32 made of an insulating material and disposed around the top shield layer 7 on the top shield gap film 6. The insulating layer 32 is made of alumina, for example. The top shield layer 7 and the insulating layer 32 are flattened at the top.

An end of the MR element 5 is located in the medium facing surface 201a. The MR element 5 may be an element made of a magneto-sensitive film that exhibits a magnetoresistive effect, such as an anisotropic magnetoresistive (AMR) element, a giant magnetoresistive (GMR) element, or a tunneling magnetoresistive (TMR) element. The GMR element may be of either the current-in-plane (CIP) type in which a current used for detecting magnetic signals is fed in a direction nearly parallel to the plane of layers constituting the GMR element or the current-perpendicular-to-plane (CPP) type in which the current used for detecting magnetic signals is fed in a direction nearly perpendicular to the plane of layers constituting the GMR element. The parts from the bottom shield layer 3 to the top shield layer 7 constitute a reproducing head.

The slider 201 further includes: a nonmagnetic layer 8 made of a nonmagnetic material and disposed over the top surfaces of the top shield layer 7 and the insulating layer 32; a return magnetic pole layer 10 made of a magnetic material and disposed on the nonmagnetic layer 8; and an insulating layer 33 made of an insulating material and disposed around the return magnetic pole layer 10 on the nonmagnetic layer 8. The nonmagnetic layer 8 and the insulating layer 33 are made of alumina, for example. The return magnetic pole layer 10 and the insulating layer 33 are flattened at the top.

The slider 201 further includes: an insulating layer 11 disposed on part of the top surfaces of the return magnetic pole layer 10 and the insulating layer 33; a coil 12 disposed on the insulating layer 11; and a coupling layer 13 disposed on the return magnetic pole layer 10. The return magnetic pole layer 10 and the coupling layer 13 are each made of a magnetic material. The material of the return magnetic pole layer 10 and the coupling layer 13 may be CoFeN, CoNiFe, NiFe or CoFe, for example. The insulating layer 11 is made of alumina, for example. The coil 12 produces a magnetic field corresponding to data to be recorded on the recording medium. The coil 12 is planar spiral-shaped and wound around the coupling layer 13. The coil 12 is made of a conductive material such as copper.

The slider 201 further includes: an insulating layer 14 made of an insulating material and disposed around the coil 12 and in the space between every adjacent turns of the coil 12; an insulating layer 15 disposed around the insulating layer 14 and the coupling layer 13 on the insulating layer 11; and an insulating layer 16 disposed on the coil 12 and the insulating layers 14 and 15. The coil 12, the coupling layer 13 and the insulating layers 14 and 15 are flattened at the top. The insulating layer 14 is made of photoresist, for example. The insulating layers 15 and 16 are made of alumina, for example.

The slider 201 further includes: a bottom yoke layer 17 made of a magnetic material and disposed over the coupling layer 13 and the insulating layer 16; and a nonmagnetic layer 18 made of a nonmagnetic material and disposed around the bottom yoke layer 17 on the insulating layer 16. The material of the bottom yoke layer 17 may be CoFeN, CoNiFe, NiFe or CoFe, for example. The nonmagnetic layer 18 is made of alumina, for example. The bottom yoke layer 17 has an end face that is closer to the medium facing surface 201a, and this end face is located at a distance from the medium facing surface 201a. The bottom yoke layer 17 and the nonmagnetic layer 18 are flattened at the top.

The slider 201 further includes a magnetic pole 20. The magnetic pole 20 includes a first layer 20A and a second layer 20B. The first layer 20A lies over the bottom yoke layer 17 and the nonmagnetic layer 18. The first layer 20A has an end face located in the medium facing surface 201a. This end face is rectangular in shape, for example.

The second layer 20B lies on a part of the first layer 20A near the medium facing surface 201a. The second layer 20B has a front end face located in the medium facing surface 201a, and a rear end face opposite to the front end face. The front end face of the second layer 20B is rectangular in shape, for example.

The magnetic pole 20 passes a magnetic flux corresponding to the magnetic field produced by the coil 12, and produces a recording magnetic field for recording data on the recording medium by means of a perpendicular magnetic recording system. The position of the end of a bit pattern to be recorded on the recording medium depends on the position of the top edge, i.e., the edge farther from the top surface 1a of the substrate 1, of the front end face of the second layer 20B. The width of the front end face of the second layer 20B taken at the top edge defines the track width.

The width of the end face of the first layer 20A located in the medium facing surface 201a may be equal to or greater than the width of the front end face of the second layer 20B.

As shown in FIG. 4, the second layer 20B includes a first portion having the front end face, and a second portion that is located farther from the medium facing surface 201a than is the first portion and has a thickness smaller than that of the first portion. The first portion has a thickness that does not change with the distance from the medium facing surface 201a.

The top surface of the first portion is located farther from the top surface 1a of the substrate 1 than is the top surface of the second portion. The top surface of the second layer 20B is thus bent.

The first layer 20A and the second layer 20B are each made of a magnetic metal material. The material of each of the first layer 20A and the second layer 20B may be NiFe, CoNiFe, or CoFe, for example.

The slider 201 further includes a nonmagnetic layer 21 made of a nonmagnetic material and disposed around the first layer 20A on the nonmagnetic layer 18. The nonmagnetic layer 21 is made of alumina, for example. The first layer 20A and the nonmagnetic layer 21 are flattened at the top.

The slider 201 further includes a clad layer 27 disposed over the top surfaces of the first layer 20A and the nonmagnetic layer 21, and a waveguide 26. The clad layer 27 is arranged to cover the top surfaces of the first layer 20A and the nonmagnetic layer 21 around the second layer 20B, and the rear end face and part of the top surface (the top surface of the second portion) of the second layer 20B. As shown in FIG. 4, the clad layer 27 has a groove that opens in the top surface of the clad layer 27. The waveguide 26 is accommodated in this groove. The waveguide 26 is made of a dielectric material that transmits laser light to be described later. The clad layer 27 is made of a dielectric material that has a refractive index lower than that of the waveguide 26. For example, the waveguide 26 is made of $Ta_2O_5$ which has a refractive index of approximately 2.1, and the clad layer 27 is made of alumina which has a refractive index of approximately 1.8. The first portion of the second layer 20B, the waveguide 26, and the clad layer 27 are flattened at the top. The shape of the waveguide 26 will be detailed later.

The groove of the clad layer 27 has an oblique surface that is farther from the medium facing surface 201a. The distance between the medium facing surface 201a and an arbitrary point on this oblique surface increases with increasing distance between the arbitrary point and the top surface 1a of the substrate 1. The slider 201 further includes an internal mirror 35 disposed on the oblique surface. The internal mirror 35 is made of a film of a metal such as Cu or Au having a thickness of 50 to 200 nm or so. The internal mirror 35 reflects laser light described later so that the reflected laser light travels through the waveguide 26 toward the medium facing surface 201a.

The slider 201 further includes an interposition layer 25 disposed over the top surfaces of the first portion of the second layer 20B, the wave guide 26 and the clad layer 27. The interposition layer 25 is made of a dielectric material that has a refractive index lower than that of the waveguide 26 and transmits the laser light. For example, the interposition layer 25 is made of alumina which has a refractive index of approximately 1.8. The interposition layer 25 has a thickness within the range of 30 to 70 nm, for example.

The slider 201 further includes a convergent lens 30, a support layer 24 that supports the convergent lens 30, a near-field light generating element 23, and an insulating layer 29 that is made of an insulating material. The support layer 24 is disposed on the interposition layer 25. The support layer 24 has grooves 24a and 24b that open in the top surface of the support layer 24. The groove 24a accommodates the near-filed light generating element 23. The groove 24b accommodates at least a part of the convergent lens 30. The support layer 24 also functions as a clad layer for the waveguide 26.

The groove 24a is located near the medium facing surface 201a. The bottom of the groove 24a is located at the same level as the top surface of the interposition layer 25. The near-filed light generating element 23 is accommodated in the groove 24a. The near-filed light generating element 23 and the support layer 24 are flattened at the top. The insulating layer 29 is disposed over the near-filed light generating element 23 and the support layer 24.

The groove 24b is located above the internal mirror 35. The groove 24b has a bottom that forms a concave curved surface. The insulating layer 29 has a penetrating opening 29a. The edge of the opening 29a is located directly above the edge of the groove 24b at the top surface of the support layer 24. A part of the convergent lens 30 is accommodated in the groove 24b and the opening 29a.

The top surfaces of the insulating layer 29 and the convergent lens 30 constitute the top surface 201c of the slider 201. In the slider 201, the substrate 1 has the top surface 1a facing toward the magnetic pole 20, the near-field light generating element 23, the waveguide 26, and the convergent lens 30. The top surface 201c of the slider 201 is located at an end above the top surface 1a of the substrate 1.

The near-field light generating element 23 is made of a metal. Specifically, the near-field light generating element 23 is made of one of Au, Ag, Al, Cu, Pd, Pt, Rh and Ir, or of an alloy composed of two or more of these elements. The support layer 24 is made of a dielectric material that has a refractive index lower than that of the waveguide 26 and transmits the laser light. For example, if the waveguide 26 is made of $Ta_2O_5$ which has a refractive index of approximately 2.1, the support layer 24 may be made of alumina which has a refractive index of approximately 1.8. The insulating layer 29 is made of alumina, for example. The insulating layer 29 has a thickness in the range of 0.1 to 0.5 μm, for example.

The convergent lens 30 has a bottom surface that forms a convex curved surface in contact with the bottom of the groove 24b, and a top surface that forms a convex curved surface. The convergent lens 30 has a refractive index higher than that of the support layer 24. The top surface of the convergent lens 30 protrudes upward from the top surface of the insulating layer 29. The convergent lens 30 has a circular planar shape, for example. The convergent lens 30 is made of a dielectric material that transmits the laser light. For example, if the support layer 24 is made of alumina which has a refractive index of approximately 1.8, the convergent lens 30 may be made of $Ta_2O_5$ which has a refractive index of approximately 2.1. The convergent lens 30 transmits light that is emitted from a light source disposed above the waveguide 26, so that the light transmitted through the convergent lens 30 is incident on the waveguide 26.

As shown in FIG. 6, the near-field light generating element 23 has a near-field light generating part 23g located in the medium facing surface 201a. The near-field light generating element 23 is in the shape of a triangular prism, having an outer surface described below. The outer surface of the near-field light generating element 23 includes: a first end face 23a that is located in the medium facing surface 201a; a second end face 23b that is farther from the medium facing surface 201a; and a coupling portion that couples the first end face 23a and the second end face 23b to each other. The coupling portion includes: a top surface 23c that is farther from the top surface 1a of the substrate 1; two side surfaces 23d and 23e that decrease in distance from each other with decreasing distance to the top surface 1a of the substrate 1; and an edge part 23f that connects the two side surfaces 23d and 23e to each other. The first end face 23a is shaped like an isosceles triangle with the vertex downward. The first end face 23a includes the near-field light generating part 23g. Specifically, the near-field light generating part 23g refers to the end of the edge part 23f and its vicinity in the end face 23a.

As shown in FIG. 6, the length of the near-field light generating element 23 in the direction perpendicular to the medium facing surface 201a will be denoted by the symbol $H_{PA}$; the width of the first end face 23a at its top edge will be denoted by the symbol $W_{PA}$; and the length of the first end face 23a in the direction perpendicular to the top surface 1a of the substrate 1 will be denoted by the symbol $T_{PA}$. The length $H_{PA}$ of the near-field light generating element 23 in the direction perpendicular to the medium facing surface 201a is greater than the length $T_{PA}$ of the first end face 23a in the direction perpendicular to the top surface 1a of the substrate 1. Both of $W_{PA}$ and $T_{PA}$ are smaller than or equal to the wavelength of light that propagates through the waveguide 26. $W_{PA}$ falls within the range of 50 to 150 nm, for example. $T_{PA}$ falls within the range of 50 to 150 nm, for example. $H_{PA}$ falls within the range of 0.25 to 2.5 μm, for example.

Figure 2:
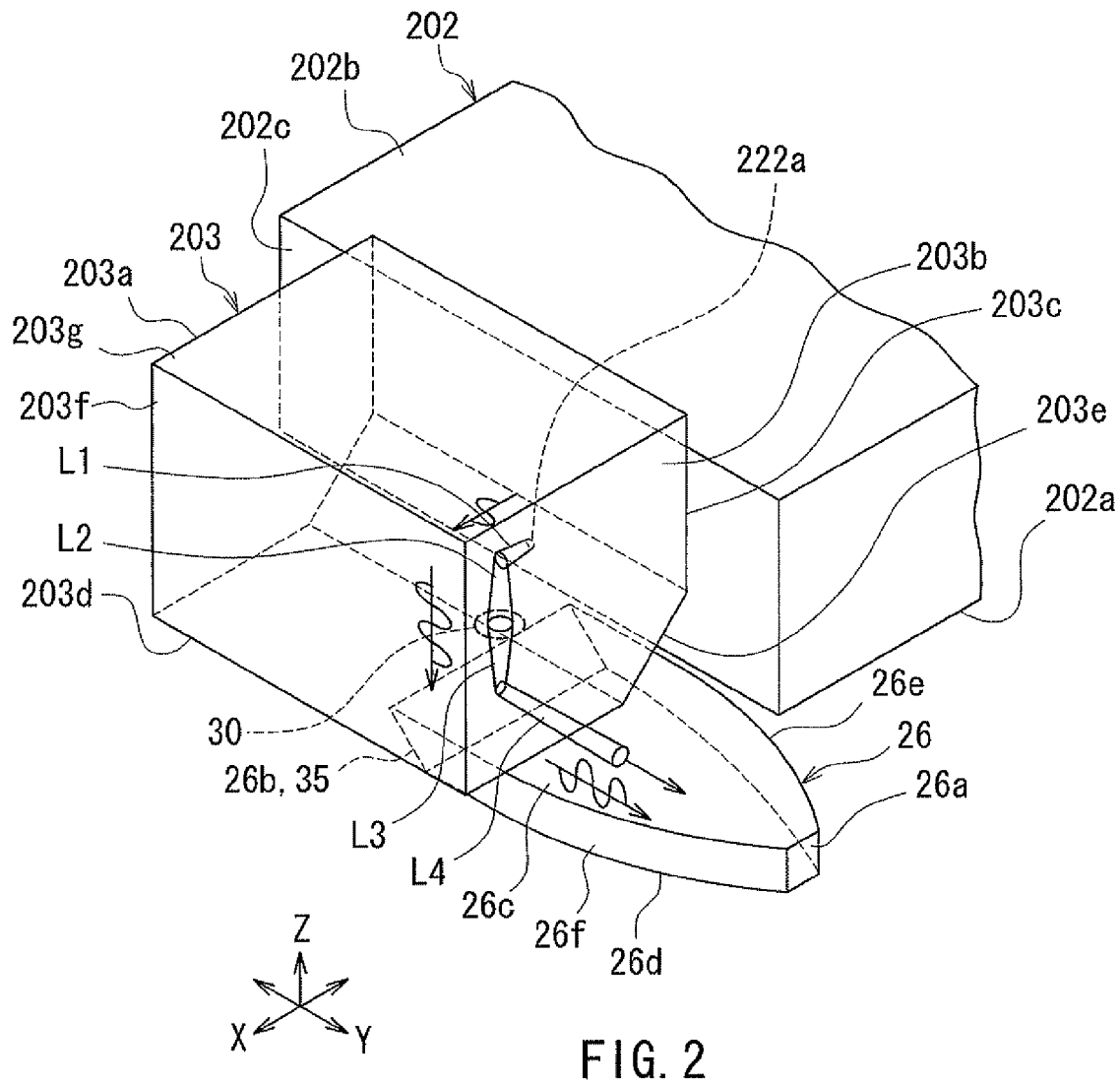
FIG. 2 is a perspective view showing the positional relationship between the laser diode, external mirror, internal mirror, convergent lens, and waveguide of FIG. 1, and the direction of polarization of laser light.

A detailed description will now be given of the shape of the waveguide 26 with reference to FIG. 1, FIG. 2 and FIG. 4. FIG. 2 is a perspective view showing the positional relationship between the laser diode 202, the external mirror 203, the internal mirror 35, the convergent lens 30, and the waveguide 26 of FIG. 1, and the direction of polarization of laser light described later. The X, Y and Z directions shown in FIG. 1 are also shown in FIG. 2.

As shown in FIG. 1, FIG. 2 and FIG. 4, the waveguide 26 extends in the direction perpendicular to the medium facing surface 201a (the Y direction). The waveguide 26 has an outer surface. The outer surface includes: a front end face 26a that is closer to the medium facing surface 201a; a rear end face 26b that is farther from the medium facing surface 201a; a top surface 26c that is farther from the top surface 1a of the substrate 1; a bottom surface 26d that is closer to the top surface 1a of the substrate 1; and two side surfaces 26e and 26f that are opposite to each other in the track width direction. The front end face 26a is opposed to the rear end face of the second layer 20B with a part of the clad layer 27 interposed therebetween.

As shown in FIG. 6, the outer surface of the waveguide 26 includes an opposed portion 26g that is opposed to a part of the coupling portion of the outer surface of the near-field light generating element 23. In the present embodiment, in particular, the opposed portion 26g is a portion of the top surface 26c of the waveguide 26 that is opposed to a part of the edge part 23f of the near-field light generating element 23 and its vicinity with the interposition layer 25 interposed therebetween. The previously-mentioned configuration that the length $H_{PA}$ of the near-field light generating element 23 in the direction perpendicular to the medium facing surface 201a is greater than the length $T_{PA}$ of the first end face 23a in the direction perpendicular to the top surface 1a of the substrate 1 is necessary in order that the opposed portion 26g, which is a part of the top surface 26c of the waveguide 26, is opposed to a part of the edge part 23f of the near-field light generating element 23 and its vicinity with the interposition layer 25 interposed therebetween.

As shown in FIG. 4, the rear end face 26b is in contact with the internal mirror 35. The distance between the medium facing surface 201a and an arbitrary point on the rear end face 26b increases with increasing distance between the arbitrary point and the top surface 1a of the substrate 1.

As shown in FIG. 2 and FIG. 4, the internal mirror 35 is configured to reflect the light transmitted through the convergent lens 30 so that the reflected light travels through the waveguide 26 toward the medium facing surface 201a. More specifically, the internal mirror 35 is configured to reflect the light that enters the waveguide 26 from the top surface 26c of the waveguide 26 and reaches the rear end face 26b so as to let the light travel toward the front end face 26a.

Figure 3:
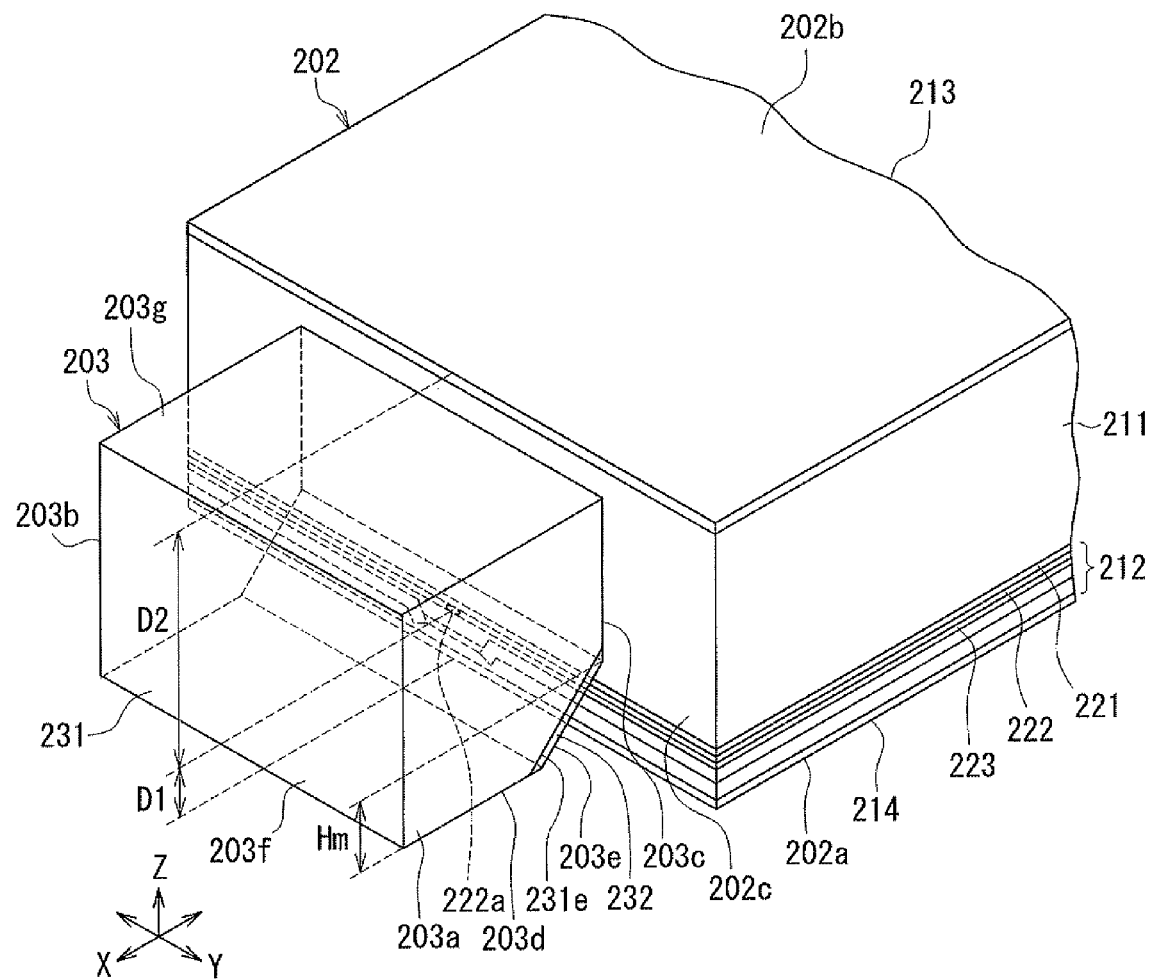
FIG. 3 is a perspective view showing the laser diode and the external mirror of FIG. 1.

Reference is now made to FIG. 3 to describe the laser diode 202 and the external mirror 203. FIG. 3 is a perspective view showing the laser diode 202 and the external mirror 203. As shown in FIG. 3, the laser diode 202 includes: an n-substrate 211 having a top surface and a bottom surface; a laser structure part 212 disposed under the bottom surface of the n-substrate 211; an n-electrode 213 joined to the top surface of the n-substrate 211; and a p-electrode 214 joined to the laser structure part 212 so that the laser structure part 212 is sandwiched between the n-substrate 211 and the p-electrode 214. The laser structure part 212 includes at least an n-clad layer 221, an active layer 222, and a p-clad layer 223. The n-clad layer 221 is disposed between the n-substrate 211 and the active layer 222. The p-clad layer 223 is disposed between the p-electrode 214 and the active layer 222. The active layer 222 has a surface that faces the n-clad layer 221, and a surface that faces the p-clad layer 223.

The laser diode 202 is rectangular-solid-shaped, having a bottom surface 202a and a top surface 202b lying at opposite ends in a direction perpendicular to the plane of the active layer 222, and four surfaces that connect the bottom surface 202a and the top surface 202b to each other. The bottom surface 202a and the top surface 202b are parallel to the plane of the active layer 222. The bottom surface 202a is formed by the surface of the p-electrode 214. The top surface 202b is formed by the surface of the n-electrode 213. One of the four surfaces that connect the bottom surface 202a and the top surface 202b to each other is a surface 202c. The surface 202c includes an emission part 222a for emitting laser light. The emission part 222a lies at an end of the active layer 222. Hereinafter, the surface 202c will be referred to as the emitting end face. The bottom surface 202a and the top surface 202b each have an area greater than that of the emitting end face 202c.

The laser diode 202 is fixed to the slider 201, being arranged so that the bottom surface 202a lying at an end in the direction perpendicular to the plane of the active layer 222 faces the top surface 201c of the slider 201. In the present embodiment, in particular, the bottom surface 202a of the laser diode 202 is joined to the top surface 201c of the slider 201. For example, an adhesive is used to join the bottom surface 202a of the laser diode 202 to the top surface 201c of the slider 201.

The slider 201 may include a conductor layer that is arranged to be exposed in the top surface 201c and connects the p-electrode 214 of the laser diode 202 to one of the terminals 210. Here, the p-electrode 214 may be electrically connected to the conductor layer by joining the bottom surface 202a of the laser diode 202 to the top surface 201c of the slider 201. In such a case, the bottom surface 202a of the laser diode 202 and the conductor layer are connected to each other by soldering, for example. The n-electrode 213 of the laser diode 202 is connected to another one of the terminals 210 with a bonding wire, for example.

In the present embodiment, as shown in FIG. 3, the distance D1 between the bottom surface 202a and the emission part 222a of the laser diode 202 is smaller than the distance D2 between the top surface 202b and the emission part 222a of the laser diode 202.

The external mirror 203 is in the shape of a pentagonal prism. More specifically, the external mirror 203 has two end faces 203a and 203b that face toward opposite directions, and five surfaces that connect the two end faces 203a and 203b to each other. The five surfaces include a first reference surface 203c, a second reference surface 203d, a reflecting surface 203e, and surfaces 203f and 203g. The first reference surface 203c is parallel to the emitting end face 202c of the laser diode 202, and faces the emitting end face 202c. The second reference surface 203d is parallel to the bottom surface 202a of the laser diode 202, and faces toward the same direction as the bottom surface 202a does. The reflecting surface 203e is oblique with respect to each of the first reference surface 203c and the second reference surface 203d, and connects the first reference surface 203c and the second reference surface 203d to each other. The surface 203f lies opposite to the first reference surface 203c and is parallel to the first reference surface 203c. The surface 203g lies opposite to the second reference surface 203d and is parallel to the second reference surface 203d. The surfaces 203f and 203g are orthogonal to each other. The surfaces 203c and 203g are orthogonal to each other. The surfaces 203d and 203f are orthogonal to each other. The reflecting surface 203e forms an angle of 45° with respect to each of the first reference surface 203c and the second reference surface 203d.

As shown in FIG. 3, the distance (difference in level) Hm between opposite ends of the reflecting surface 203e in the direction perpendicular to the second reference surface 203d (Z direction) is greater than the distance D1 between the bottom surface 202a and the emission part 222a of the laser diode 202.

The external mirror 203 includes a block 231 in the shape of a pentagonal prism. The block 231 has the end faces 203a and 203b, the first reference surface 203c, the second reference surface 203d, the surfaces 203f and 203g, and an oblique surface 231e. The oblique surface 231e is oblique with respect to each of the first reference surface 203c and the second reference surface 203d, and connects the first reference surface 203c and the second reference surface 203d to each other. The oblique surface 231e forms an angle of 45° with respect to each of the first reference surface 203c and the second reference surface 203d. The external mirror 203 further includes a metal film 232 that adheres to the oblique surface 231e to form the reflecting surface 203e.

The block 231 may be made of an insulating material such as glass or resin, a semiconductor material such as silicon, or a metal material. The metal film 232 is made of a metal such as Au, Cu, Cr, Ag, or Al. The metal film 232 has a thickness of 50 to 200 nm or so.

The first reference surface 203c is in contact with the emitting end face 202c of the laser diode 202. In the present embodiment, in particular, the external mirror 203 is fixed to the laser diode 202 by bonding the first reference surface 203c to the emitting end face 202c. The reflecting surface 203e is located in front of the emission part 222a. The second reference surface 203d may be either in contact with or not in contact with the top surface 201c of the slider 201.

The external mirror 203 is fabricated by depositing the metal film 232, which is to constitute the reflecting surface 203e, onto the oblique surface 231e of the block 231 by vapor deposition, sputtering, or the like. The first reference surface 203c is bonded to the emitting end face 202c with an adhesive, for example.

The portion from the return magnetic pole layer 10 to the insulating layer 29, and the laser diode 202 and the external mirror 203 constitute a recording head.

Next, the path of the laser light that is emitted from the emission part 222a of the laser diode 202 will be described with reference to FIG. 1, FIG. 2, and FIG. 4. The laser light emitted from the emission part 222a of the laser diode 202 is reflected by the reflecting surface 203e of the external mirror 203 so as to be incident on the convergent lens 30. The convergent lens 30 transmits the laser light reflected by the external mirror 203. The light transmitted through the convergent lens 30 passes through the support layer 24 and the interposition layer 25, and enters the waveguide 26 from the top surface 26c to reach the rear end surface 26b. The light is then reflected by the internal mirror 35 so as to travel through the waveguide 26 toward the medium facing surface 201a (the front end surface 26a).

As shown in FIG. 2, the laser light emitted from the emission part 222a will be designated by the reference symbol L1. The laser light reflected by the external mirror 203 will be designated by the reference symbol L2. The laser light transmitted through the convergent lens 30 will be designated by the reference symbol L3. The laser light reflected by the internal mirror 35 will be designated by the reference symbol L4. The laser light L1 emitted from the emission part 222a increases in diameter with increasing distance from the emission part 222a. The laser light L2 reflected by the external mirror 203 increases in diameter with decreasing distance to the convergent lens 30. The laser light L3 transmitted through the convergent lens 30 converges so that the laser light L3 is incident on the waveguide 26 with a diameter smaller than that of the laser light L2 that would be incident on the waveguide 26 without the convergent lens 30. Note that FIG. 4 depicts a case where the convergent lens 30 exerts the function of converging the laser light both at its top surface and bottom surface. FIG. 2 and FIG. 4 also depict a case where the laser light L3 transmitted through the convergent lens 30 decreases in diameter with increasing distance from the convergent lens 30. Nevertheless, the laser light L3 transmitted through the convergent lens 30 may be a parallel beam, or may be diverging light that diverges less widely than in the case where there is no convergent lens 30.

In the present embodiment, the laser diode 202, the external mirror 203, the internal mirror 35, the convergent lens 30, and the waveguide 26 are arranged so that the direction of travel of the laser light L1 emitted from the emission part 222a and the direction of travel of the laser light L4 reflected by the internal mirror 35 are orthogonal to each other as viewed from above the top surface 201c of the slider 201.

FIG. 1 and FIG. 2 show an example of the configuration of the waveguide 26. In this example, the two side surfaces 26e and 26f of the waveguide 26 are formed as a reflecting surface of parabolic shape in the vicinity of the front end face 26a as viewed from above. This reflecting surface has the function of collecting the light propagating through the waveguide 26 to the vicinity of the front end face 26a.

With reference to FIG. 2, the direction of polarization of the laser light in the present embodiment will be described. In the present embodiment, the laser diode 202 emits linearly polarized laser light whose electric field oscillates in a direction parallel to the plane of the active layer 222, i.e., laser light of TE mode, from the emission part 222a. The direction of oscillation of the electric field of the laser light emitted from the emission part 222a is parallel to the XY plane. The laser light emitted from the emission part 222a is reflected by the reflecting surface 203e of the external mirror 203 and travels toward the convergent lens 30. Here, the direction of oscillation of the electric field of this laser light is parallel to the YZ plane. This laser light passes through the convergent lens 30, the support layer 24, and the interposition layer 25, enters the waveguide 26 from the top surface 26c, and is reflected by the internal mirror 35. The direction of oscillation of the electric field of the laser light reflected by the internal mirror 35 is parallel to the YZ plane. The laser light reflected by the internal mirror 35 propagates through the waveguide 26 to reach the opposed portion 26g. The direction of oscillation of the electric field of this laser light is perpendicular to the opposed portion 26g. This makes it possible to produce surface plasmons of high intensity on the near-field light generating element 23.

As has been described, the heat-assisted magnetic recording head 200 according to the present embodiment includes the slider 201, the edge-emitting laser diode 202 fixed to the slider 201, and the external mirror 203 provided outside the slider 201. The slider 201 includes: the medium facing surface 201a that faces the recording medium; the reproducing head; and a portion of the recording head excluding the laser diode 202 and the external mirror 203 (hereinafter, referred to as an in-slider portion of the recording head). The reproducing head and the in-slider portion of the recording head are stacked on the substrate 1. The in-slider portion of the recording head is located on the front side (trailing side) relative to the reproducing head in the direction of travel of the recording medium (Z direction).

The reproducing head includes: the MR element 5 as the reproducing element; the bottom shield layer 3 and the top shield layer 7 for shielding the MR element 5, the respective portions of the bottom shield layer 3 and the top shield layer 7 located near the medium facing surface 201a being opposed to each other with the MR element 5 therebetween; the bottom shield gap film 4 disposed between the MR element 5 and the bottom shield layer 3; and the top shield gap film 6 disposed between the MR element 5 and the top shield layer 7.

The in-slider portion of the recording head includes the return magnetic pole layer 10, the coil 12, the coupling layer 13, the bottom yoke layer 17, and the magnetic pole 20. The coil 12 produces a magnetic field corresponding to data to be recorded on the recording medium. The return magnetic pole layer 10, the coupling layer 13, the bottom yoke layer 17 and the magnetic pole 20 form a magnetic path for passing a magnetic flux corresponding to the magnetic field produced by the coil 12. The magnetic pole 20 includes the first layer 20A and the second layer 20B. The magnetic pole 20 allows the magnetic flux corresponding to the magnetic field produced by the coil 12 to pass, and produces a recording magnetic field for recording data on the recording medium by means of the perpendicular magnetic recording system. The position of the end of a bit pattern to be recorded on the recording medium depends on the position of the top edge, i.e., the edge farther from the top surface 1a of the substrate 1, of the front end face of the second layer 20B located in the medium facing surface 201a. The width of the front end face of the second layer 20B located in the medium facing surface 201a taken at the top edge defines the track width. The return magnetic pole layer 10, the coupling layer 13 and the bottom yoke layer 17 have the function of returning a magnetic flux to the magnetic pole 20, the magnetic flux having been generated from the magnetic pole 20 and having magnetized the recording medium.

The in-slider portion of the recording head further includes the near-field light generating element 23, the support layer 24, the interposition layer 25, the waveguide 26, the clad layer 27, the insulating layer 29, the convergent lens 30, and the internal mirror 35. The substrate 1 has the top surface 1a facing toward the magnetic pole 20, the near-field light generating element 23, the waveguide 26, and the convergent lens 30. The waveguide 26 is located farther from the top surface 1a of the substrate 1 than is the first layer 20A. The front end face 26a of the waveguide 26 is opposed to the rear end face of the second layer 20B. The rear end face 26b of the waveguide 26 is in contact with the internal mirror 35. The near-field light generating element 23 is located farther from the top surface 1a of the substrate 1 than is the second layer 20B. The interposition layer 25, the near-field light generating element 23, the support layer 24, the insulating layer 29, and the convergent lens 30 are located farther from the top surface 1a of the substrate 1 than is the waveguide 26. The top surfaces of the insulating layer 29 and the convergent lens 30 constitute the top surface 201c of the slider 201.

The outer surface of the near-field light generating element 23 includes: the first end face 23a that is located in the medium facing surface 201a; the second end face 23b that is farther from the medium facing surface 201a; and the coupling portion that couples the first end face 23a and the second end face 23b to each other. The coupling portion includes: the top surface 23c that is farther from the top surface 1a of the substrate 1; the two side surfaces 23d and 23e that decrease in distance from each other with decreasing distance to the top surface 1a of the substrate 1; and the edge part 23f that connects the two side surfaces 23d and 23e to each other. The first end face 23a includes the near-field light generating part 23g. The length $H_{PA}$ of the near-field light generating element 23 in the direction perpendicular to the medium facing surface 201a (the Y direction) is greater than the length $T_{PA}$ of the first end face 23a in the direction perpendicular to the top surface 1a of the substrate 1. As will be detailed later, surface plasmons are excited on the near-field light generating element 23 based on the light propagating through the waveguide 26. The surface plasmons propagate to the near-field light generating part 23g, and the near-field light generating part 23g generates near-field light based on the surface plasmons.

The waveguide 26 is located closer to the top surface 1a of the substrate 1 than is the near-field light generating element 23. The outer surface of the waveguide 26 includes the opposed portion 26g that is opposed to a part of the edge part 23f of the near-field light generating element 23 with the interposition layer 25 interposed therebetween.

The support layer 24, the interposition layer 25 and the clad layer 27 are each made of a dielectric material having a refractive index lower than that of the waveguide 26. Consequently, the outer surface of the waveguide 26 excluding the rear end face 26b is covered with the dielectric material that is lower in refractive index than the waveguide 26.

The support layer 24 has the groove 24b that accommodates at least a part of the convergent lens 30. The groove 24b has a bottom that forms a concave curved surface. The insulating layer 29 has the penetrating opening 29a. A part of the convergent lens 30 is accommodated in the groove 24b and the opening 29a. The convergent lens 30 has a bottom surface that forms a convex curved surface in contact with the bottom of the groove 24b, and a top surface that forms a convex curved surface. The convergent lens 30 has a refractive index higher than that of the support layer 24.

The recording head further includes the edge-emitting laser diode 202 fixed to the slider 201, and the external mirror 203 fixed to the laser diode 202. The laser diode 202 includes: the active layer 222; the emitting end face 202c that lies at an end in the direction parallel to the plane of the active layer 222 and includes the emission part 222a for emitting laser light; and the bottom surface 202a that lies at an end in the direction perpendicular to the plane of the active layer 222. The laser diode 202 is arranged so that the bottom surface 202a faces the top surface 201c of the slider 201. The external mirror 203 reflects the laser light emitted from the emission part 222a so that the reflected laser light is incident on the convergent lens 30. The convergent lens 30 transmits the laser light reflected by the external mirror 203. The laser light transmitted through the convergent lens 30 passes through the support layer 24 and the interposition layer 25, and is incident on the waveguide 26. The laser light is incident on the waveguide 26 with a diameter smaller than that of the laser light that would be incident on the waveguide 26 without the convergent lens 30.

Now, the principle of generation of near-field light in the present embodiment and the principle of heat-assisted magnetic recording using the near-field light will be described in detail. As described above, the laser light emitted from the emission part 222a of the laser diode 202 is reflected by the external mirror 203, passes through the convergent lens 30, the support layer 24 and the interposition layer 25, enters the waveguide 26 from the top surface 26c and reaches the rear end face 26b, where the laser light is reflected by the internal mirror 35 so as to travel through the waveguide 26 toward the medium facing surface 201a (the front end face 26a). This laser light propagates through the waveguide 26 to reach the vicinity of the opposed portion 26g. The laser light is then totally reflected at the interface between the opposed portion 26g and the interposition layer 25, and this generates evanescent light permeating into the interposition layer 25. As a result, the evanescent light and the collective oscillations of charges on a part of the coupling portion (a part of the edge part 23f and its vicinity) of the outer surface of the near-field light generating element 23, i.e., surface plasmons, are coupled with each other to excite a system of surface plasmon polaritons. In this way, surface plasmons are excited on the near-field light generating element 23.

The surface plasmons excited on the near-field light generating element 23 propagate along the edge part 23f of the near-field light generating element 23 toward the near-field light generating part 23g. Consequently, the surface plasmons concentrate at the near-field light generating part 23g, and the near-field light generating part 23g generates near-field light based on the surface plasmons. The near-field light is projected toward the recording medium, reaches the surface of the recording medium and heats a part of the magnetic recording layer of the recording medium. This lowers the coercivity of the part of the magnetic recording layer. In heat-assisted magnetic recording, the part of the magnetic recording layer with the lowered coercivity is subjected to a recording magnetic field produced by the magnetic pole 20 for data recording.

Reference is now made to FIG. 7A to FIG. 18A and FIG. 7B to FIG. 18B to describe a method of manufacturing the heat-assisted magnetic recording head 200 according to the present embodiment. FIG. 7A to FIG. 18A each show a cross section of a stack of layers in the process of manufacturing the heat-assisted magnetic recording head 200, the cross section being perpendicular to the medium facing surface 201a and the top surface 1a of the substrate 1. In FIG. 7A to FIG. 18A, the symbol "ABS" indicates the position where the medium facing surface 201a is to be formed. FIG. 7B to FIG. 18B show cross sections at the position ABS of FIG. 7A to FIG. 18A, respectively.

Figure 7A:
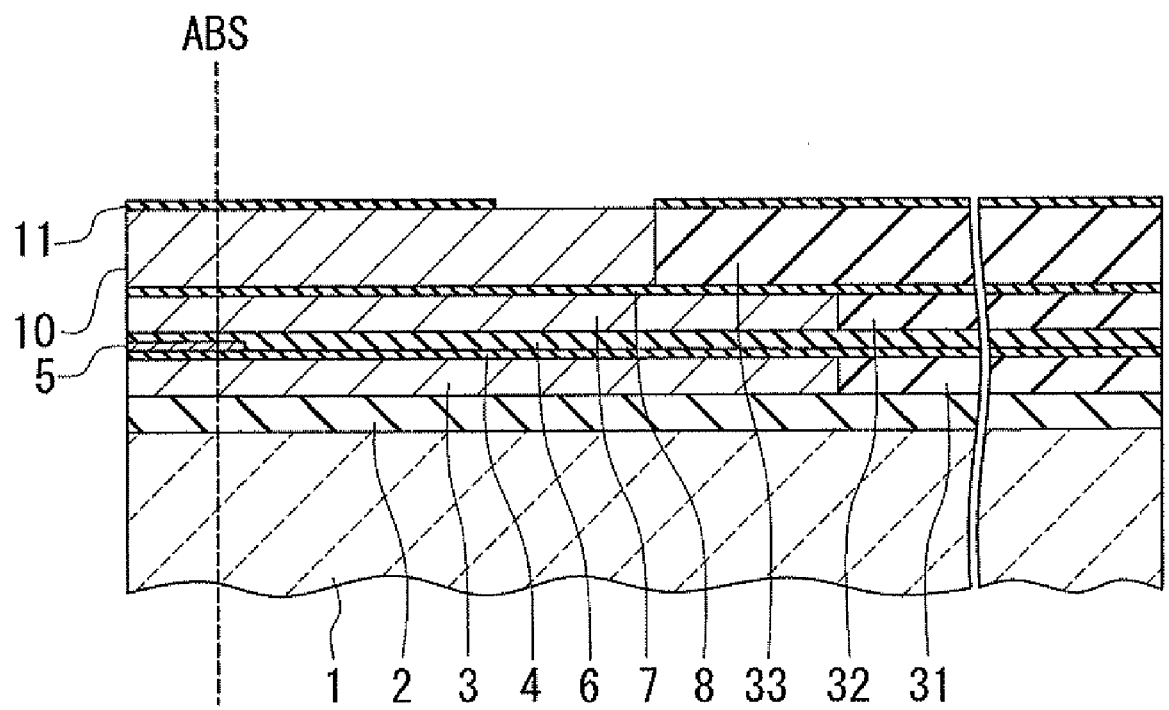
FIG. 7A and FIG. 7B are explanatory diagrams showing a step of a method of manufacturing the heat-assisted magnetic recording head according to the first embodiment of the invention.
Figure 7B:
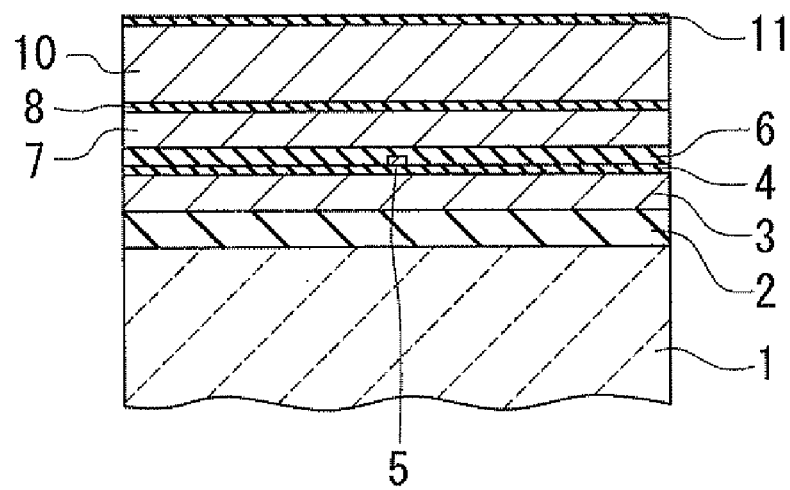

In the method of manufacturing the heat-assisted magnetic recording head 200 according to the present embodiment, first, the insulating layer 2 is formed on the substrate 1 as shown in FIG. 7A and FIG. 7B. Next, the bottom shield layer 3 is formed on the insulating layer 2. Next, the insulating layer 31 is formed to cover the bottom shield layer 3. The insulating layer 31 is then polished by, for example, chemical mechanical polishing (hereinafter referred to as CMP), until the bottom shield layer 3 is exposed. The bottom shield layer 3 and the insulating layer 31 are thereby flattened at the top. Next, the bottom shield gap film 4 is formed over the bottom shield layer 3 and the insulating layer 31. Next, the MR element 5 and not-shown leads connected to the MR element 5 are formed on the bottom shield gap film 4. Next, the top shield gap film 6 is formed to cover the MR element 5 and the leads. Next, the top shield layer 7 is formed on the top shield gap film 6. Next, the insulating layer 32 is formed to cover the top shield layer 7. The insulating layer 32 is then polished by, for example, CMP, until the top shield layer 7 is exposed. The top shield layer 7 and the insulating layer 32 are thereby flattened at the top. Next, the nonmagnetic layer 8 is formed over the top shield layer 7 and the insulating layer 32. Next, the return magnetic pole layer 10 is formed on the nonmagnetic layer 8. Next, the insulating layer 33 is formed to cover the return magnetic pole layer 10. The insulating layer 33 is then polished by, for example, CMP, until the return magnetic pole layer 10 is exposed. The return magnetic pole layer 10 and the insulating layer 33 are thereby flattened at the top. Next, the insulating layer 11 is formed on part of the top surfaces of the return magnetic pole layer 10 and the insulating layer 33.

Figure 8A:
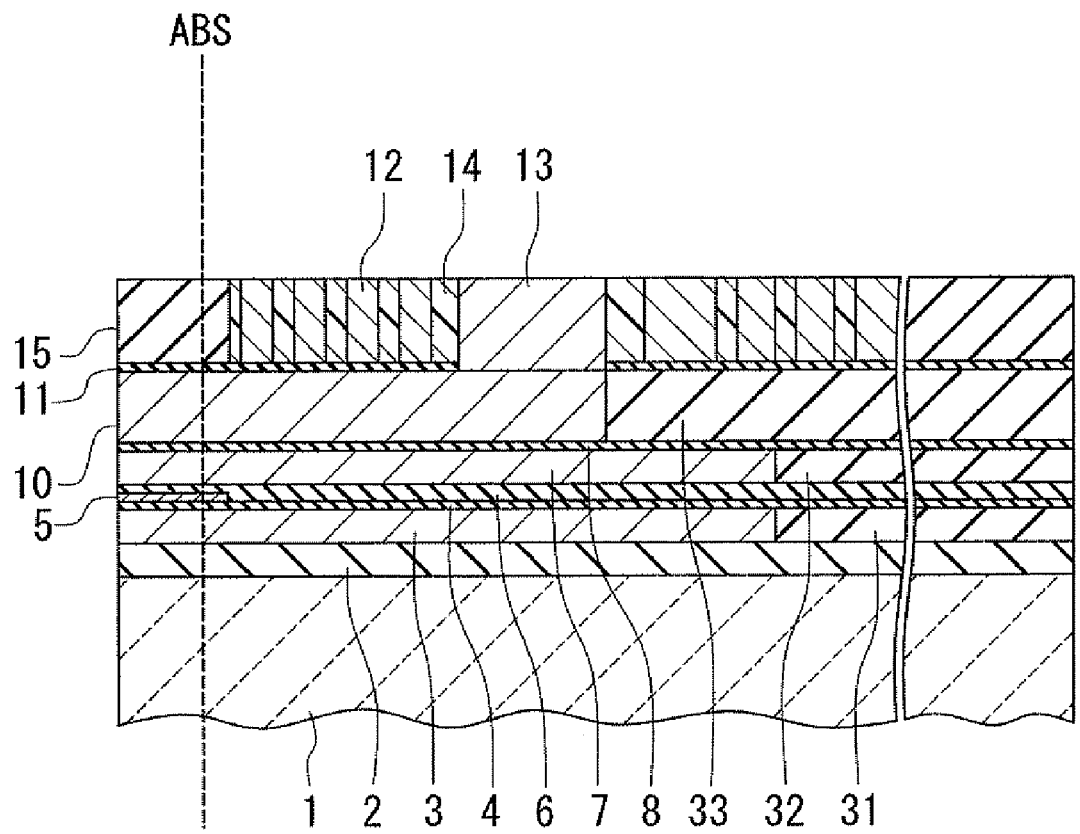
FIG. 8A and FIG. 8B are explanatory diagrams showing a step that follows the step of FIG. 7A and FIG. 7B.
Figure 8B:
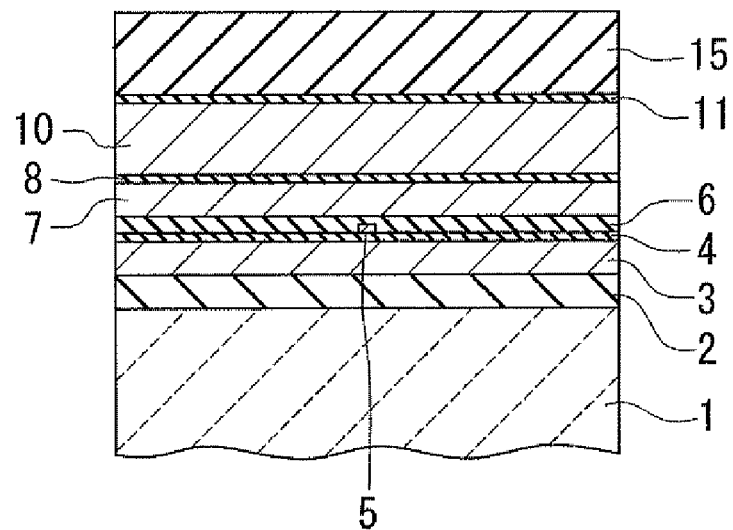

FIG. 8A and FIG. 8B show the next step. In this step, first, the coil 12 is formed on the insulating layer 11 by frame plating, for example. Next, the coupling layer 13 is formed on the return magnetic pole layer 10 by frame plating, for example. Alternatively, the coil 12 may be formed after the formation of the coupling layer 13. Next, the insulating layer 14 made of, for example, photoresist, is selectively formed around the coil 12 and in the space between every adjacent turns of the coil 12. Next, the insulating layer 15 is formed over the entire top surface of the stack by sputtering, for example. The insulating layer 15 is then polished by, for example, CMP, until the coil 12 and the coupling layer 13 are exposed. The coil 12, the coupling layer 13, and the insulating layers 14 and 15 are thereby flattened at the top.

Figure 9A:
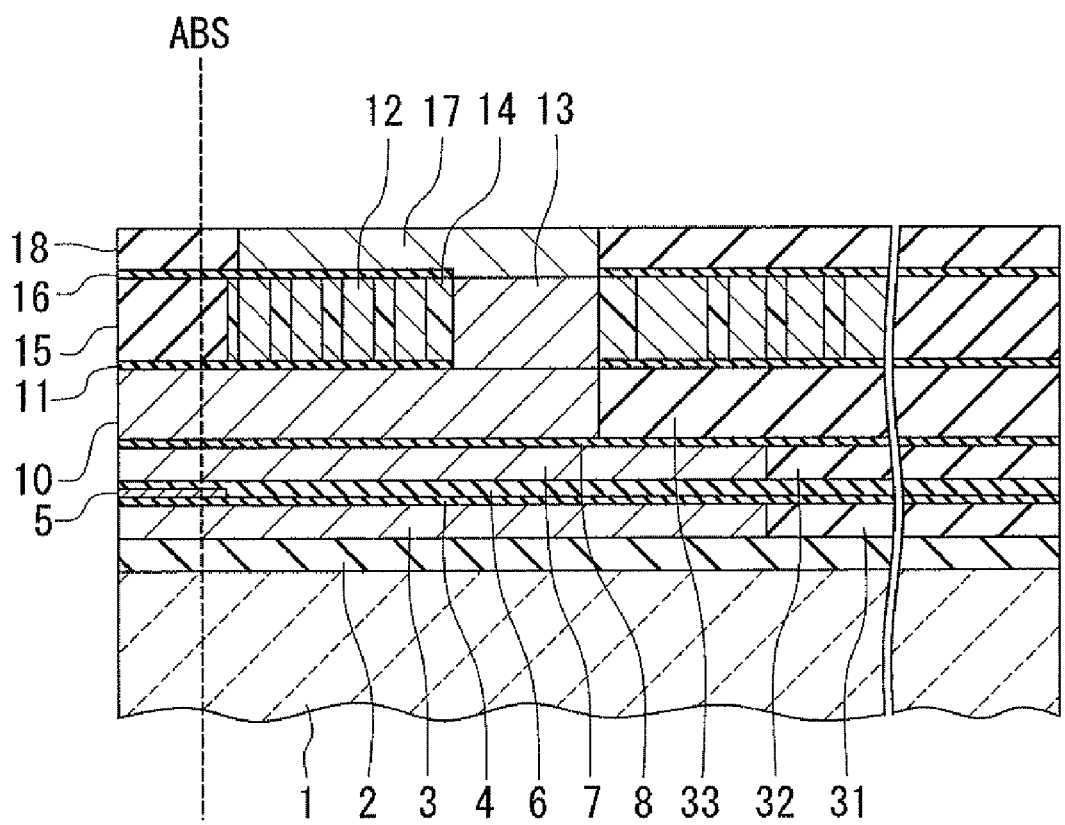
FIG. 9A and FIG. 9B are explanatory diagrams showing a step that follows the step of FIG. 8A and FIG. 8B.
Figure 9B:
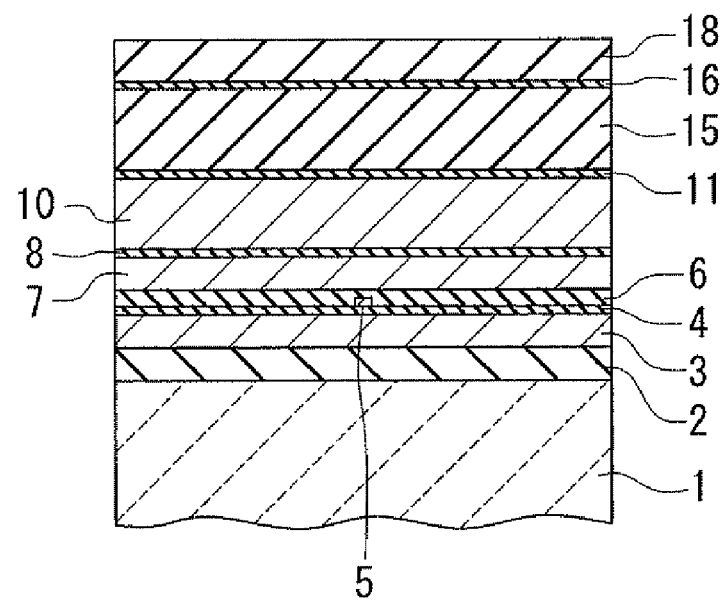

FIG. 9A and FIG. 9B show the next step. In this step, first, the insulating layer 16 is formed. Next, the bottom yoke layer 17 is formed over the coupling layer 13 and the insulating layer 16 by frame plating, for example. Next, the nonmagnetic layer 18 is formed over the entire top surface of the stack. The nonmagnetic layer 18 is then polished by, for example, CMP, until the bottom yoke layer 17 is exposed. The bottom yoke layer 17 and the nonmagnetic layer 18 are thereby flattened at the top.

Figure 10A:
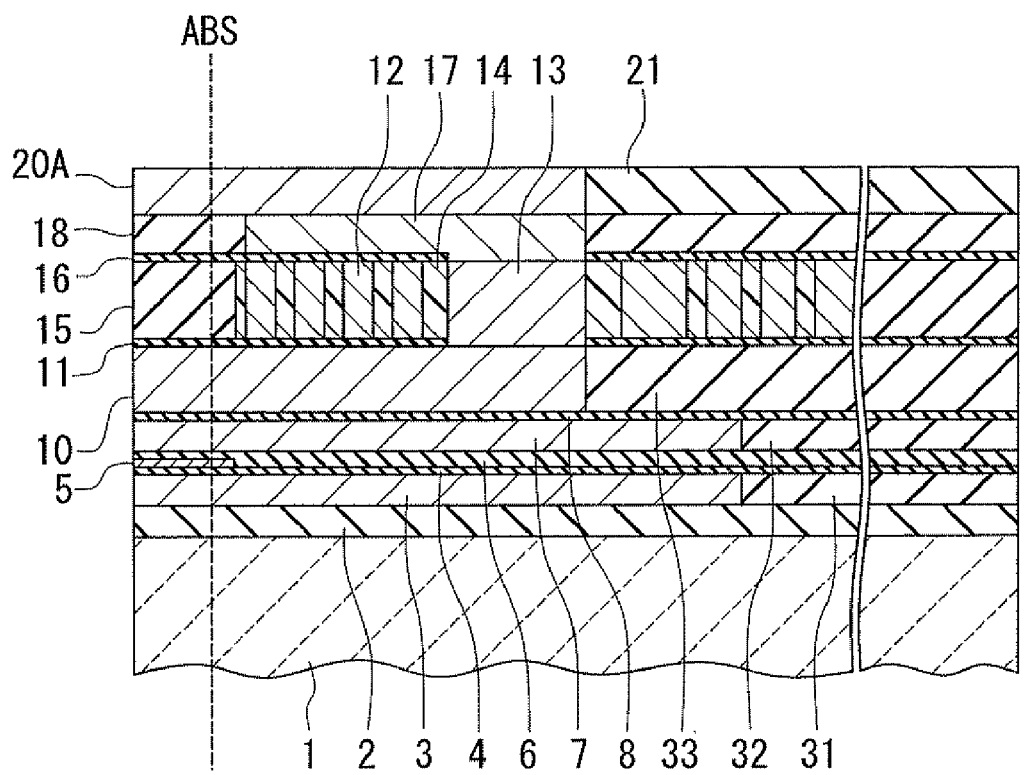
FIG. 10A and FIG. 10B are explanatory diagrams showing a step that follows the step of FIG. 9A and FIG. 9B.
Figure 10B:
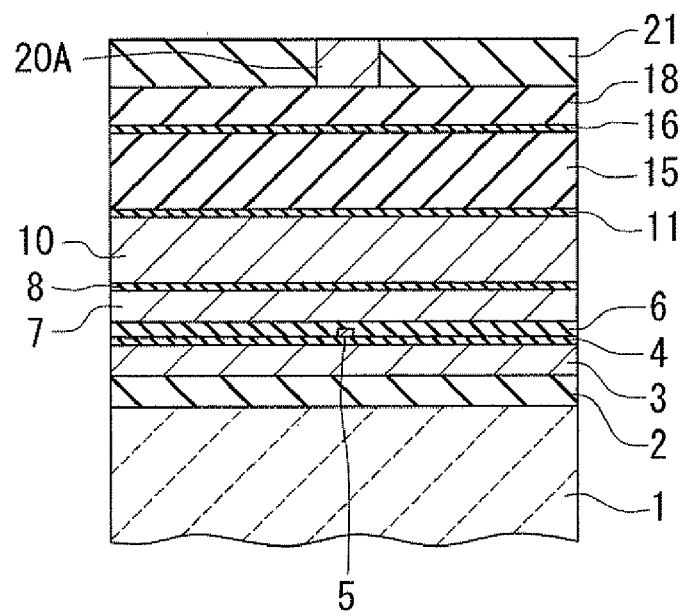

FIG. 10A and FIG. 10B show the next step. In this step, first, the first layer 20A is formed over the bottom yoke layer 17 and the nonmagnetic layer 18 by frame plating, for example. Next, the nonmagnetic layer 21 is formed over the entire top surface of the stack. The nonmagnetic layer 21 is then polished by, for example, CMP, until the first layer 20A is exposed. The first layer 20A and the nonmagnetic layer 21 are thereby flattened at the top.

Figure 11A:
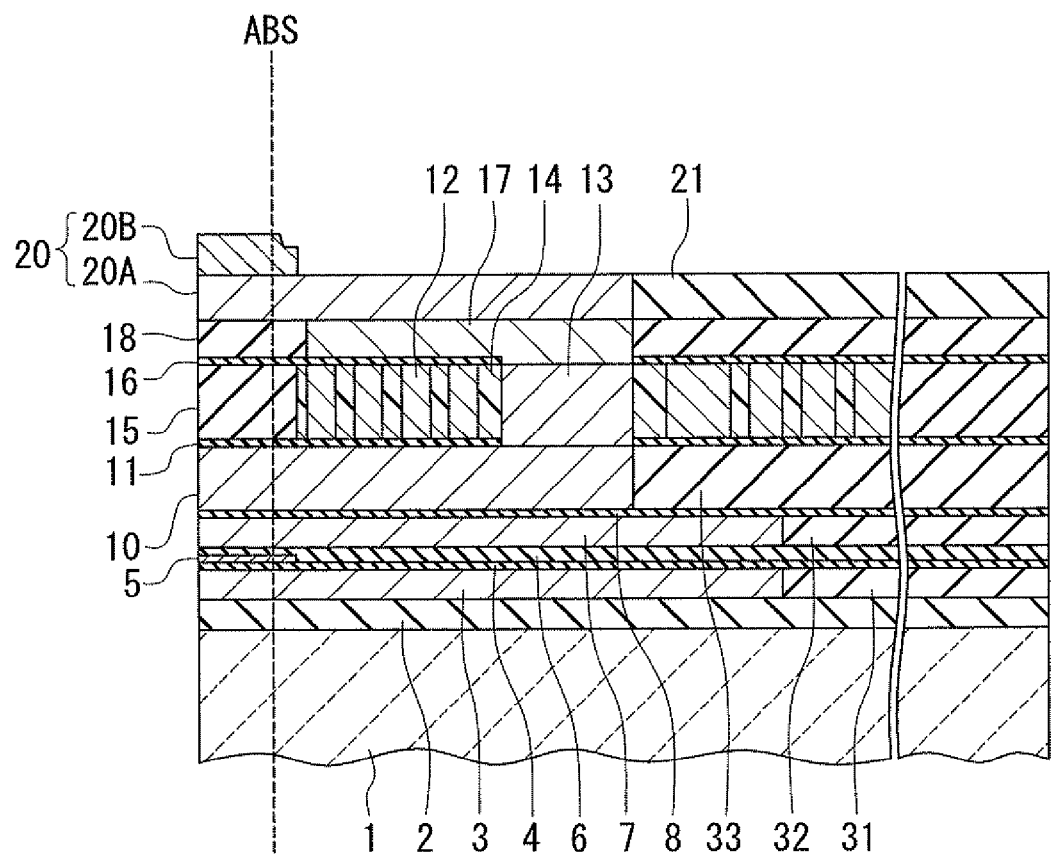
FIG. 11A and FIG. 11B are explanatory diagrams showing a step that follows the step of FIG. 10A and FIG. 10B.
Figure 11B:
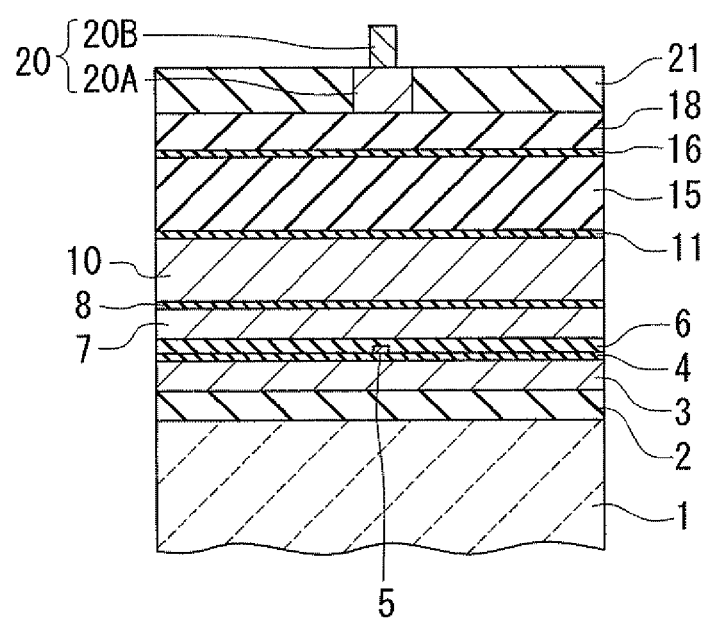

FIG. 11A and FIG. 11B show the next step. In this step, first, a magnetic layer that is intended to become the second layer 20B later is formed on the first layer 20A by frame plating, for example. A part of the magnetic layer is then etched by, for example, ion beam etching, so that the first portion and the second portion are formed in the magnetic layer and the magnetic layer thereby becomes the second layer 20B.

Figure 12A:
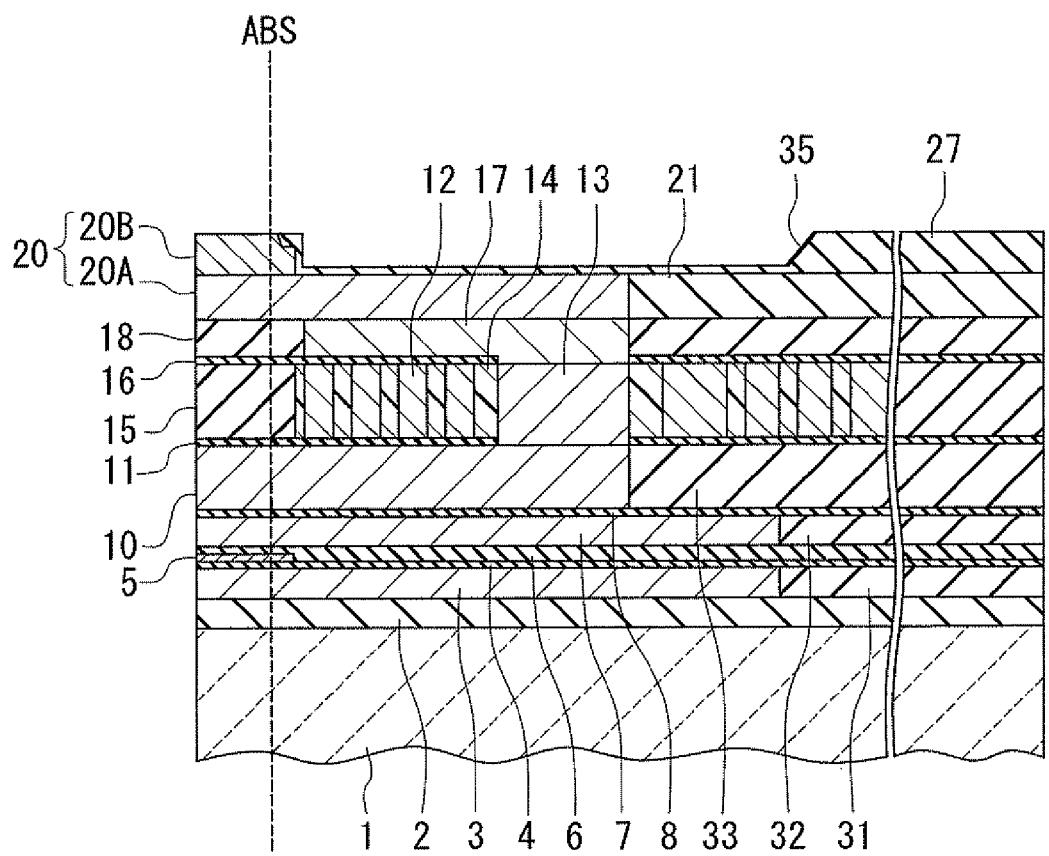
FIG. 12A and FIG. 12B are explanatory diagrams showing a step that follows the step of FIG. 11A and FIG. 11B.
Figure 12B:
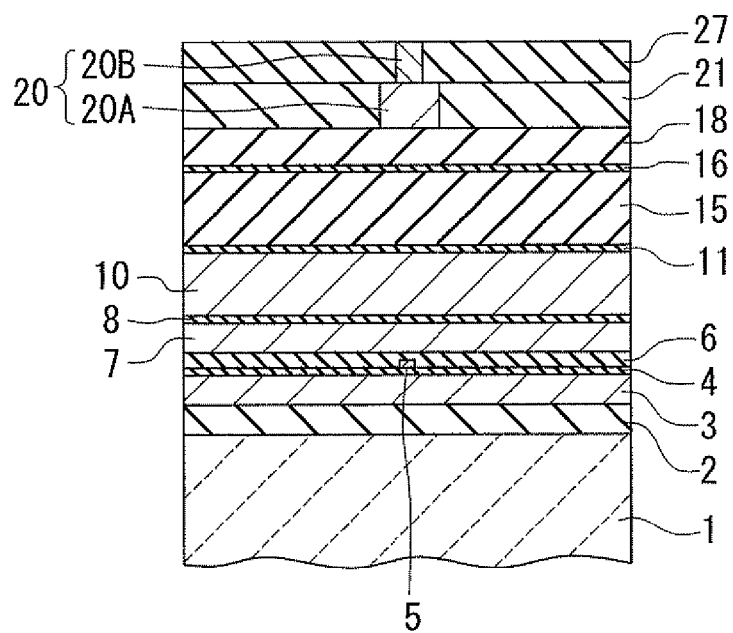

FIG. 12A and FIG. 12B show the next step. In this step, first, a dielectric layer that is intended to become the clad layer 27 later is formed over the entire top surface of the stack. The dielectric layer is then polished by, for example, CMP, until the first portion of the second layer 20B is exposed. The first portion of the second layer 20B and the dielectric layer are thereby flattened at the top. Next, the dielectric layer is selectively etched by, for example, reactive ion etching (hereinafter referred to as RIE) to thereby form in the dielectric layer a groove for accommodating the waveguide 26 to be formed later. Here, the dielectric layer is taper-etched so that the groove will have an oblique surface for the internal mirror 35 to be formed thereon later. With the groove formed therein, the remaining dielectric layer becomes the clad layer 27. Next, the internal mirror 35 is formed on the oblique surface of the groove of the clad layer 27.

Figure 13A:
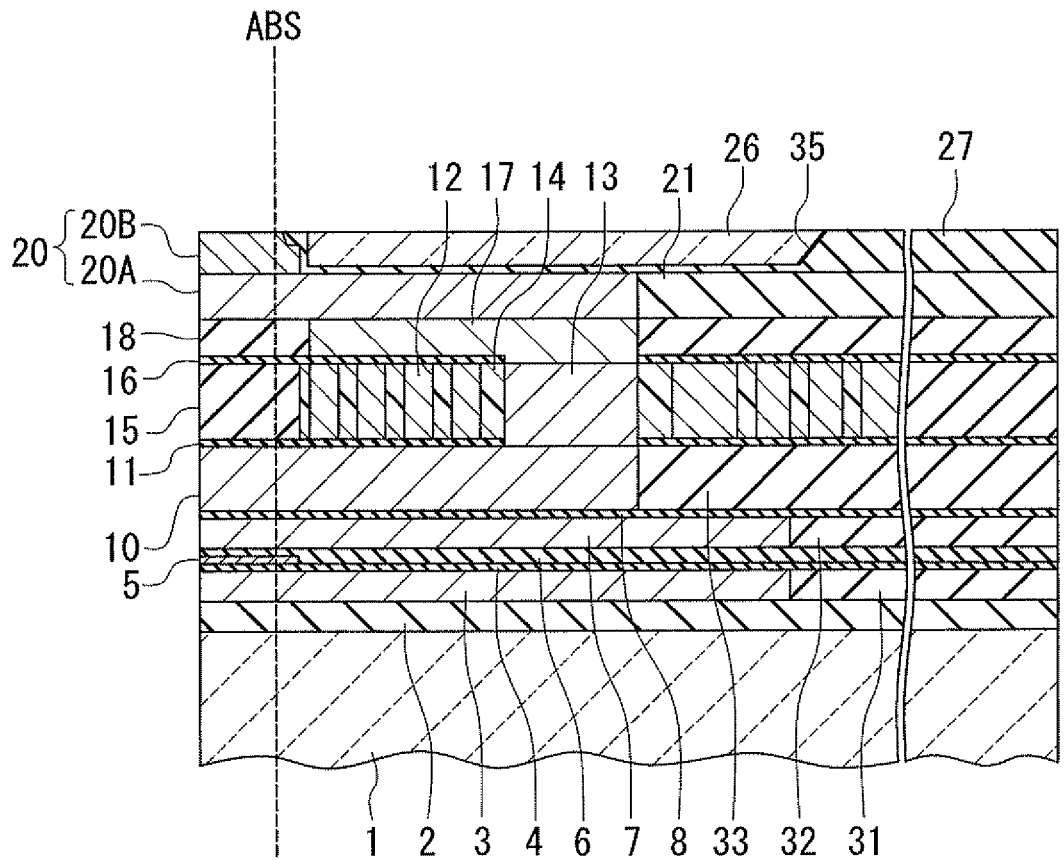
FIG. 13A and FIG. 13B are explanatory diagrams showing a step that follows the step of FIG. 12A and FIG. 12B.
Figure 13B:
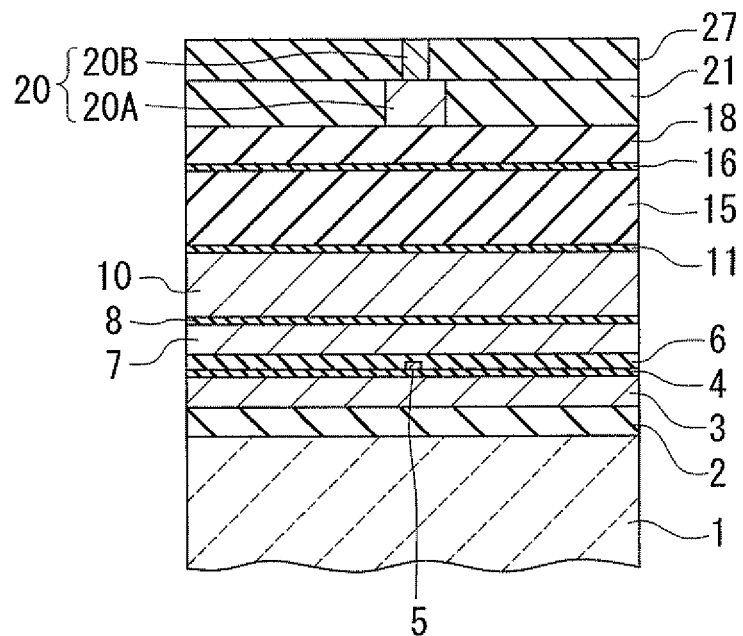

FIG. 13A and FIG. 13B show the next step. In this step, first, a dielectric layer that is intended to become the waveguide 26 later is formed over the entire top surface of the stack. The dielectric layer is then polished by, for example, CMP, until the first portion of the second layer 20B and the clad layer 27 are exposed. The first portion of the second layer 20B, the clad layer 27, and the dielectric layer are thereby flattened at the top. As a result, the dielectric layer remaining in the groove of the clad layer 27 becomes the waveguide 26.

Figure 14A:
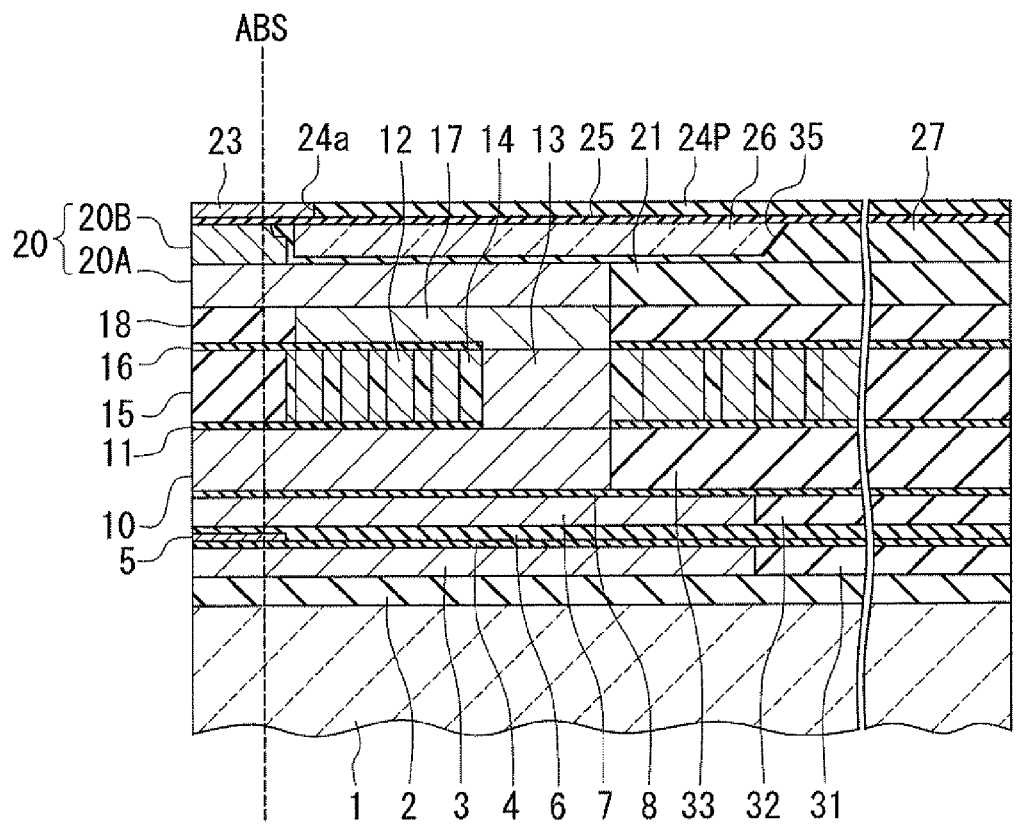
FIG. 14A and FIG. 14B are explanatory diagrams showing a step that follows the step of FIG. 13A and FIG. 13B.
Figure 14B:
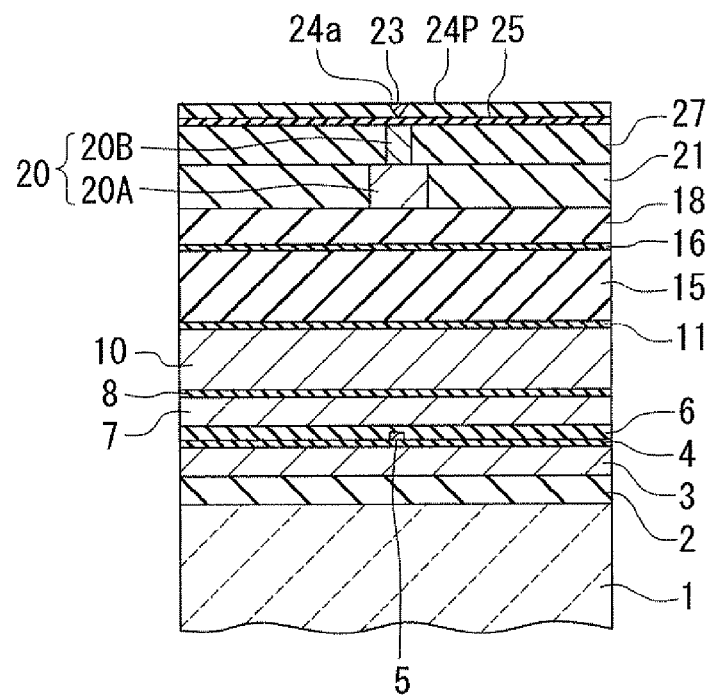

FIG. 14A and FIG. 14B show the next step. In this step, first, the interposition layer 25 is formed over the first portion of the second layer 20B, the waveguide 26, and the clad layer 27. Next, an initial support layer 24P, which is intended to undergo the formation of the grooves 24a and 24b therein later to thereby become the support layer 24, is formed on the interposition layer 25. The initial support layer 24P is then selectively etched to form the groove 24a in the initial support layer 24. Next, the near-field light generating element 23 is formed to be accommodated in the groove 24a.

Figure 15A:
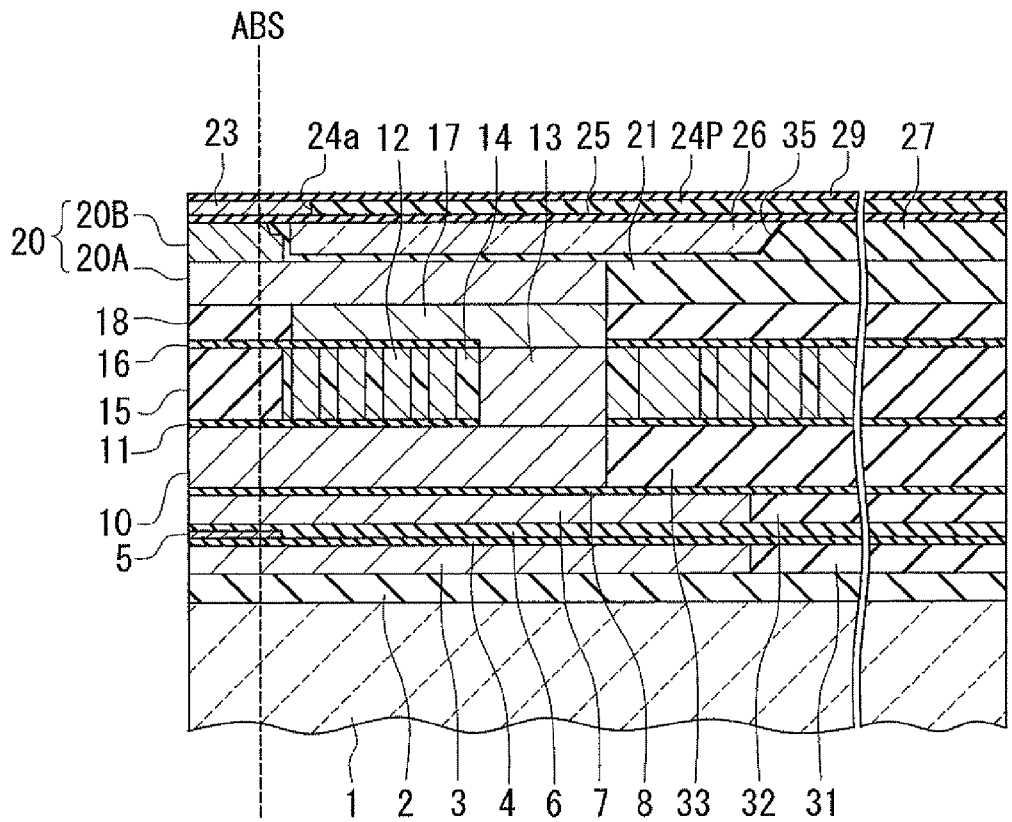
FIG. 15A and FIG. 15B are explanatory diagrams showing a step that follows the step of FIG. 14A and FIG. 14B.
Figure 15B:
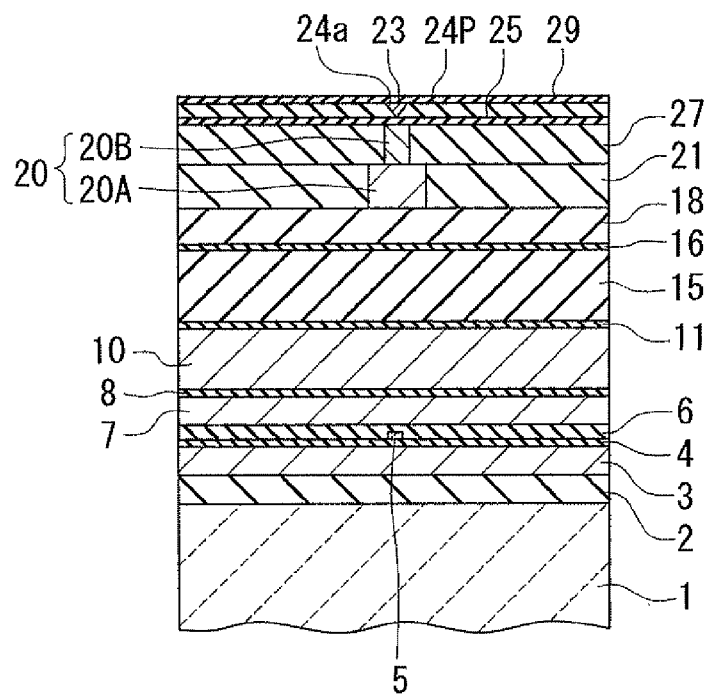

Next, as shown in FIG. 15A and FIG. 15B, the insulating layer 29 is formed over the entire top surface of the stack.

Figure 16A:
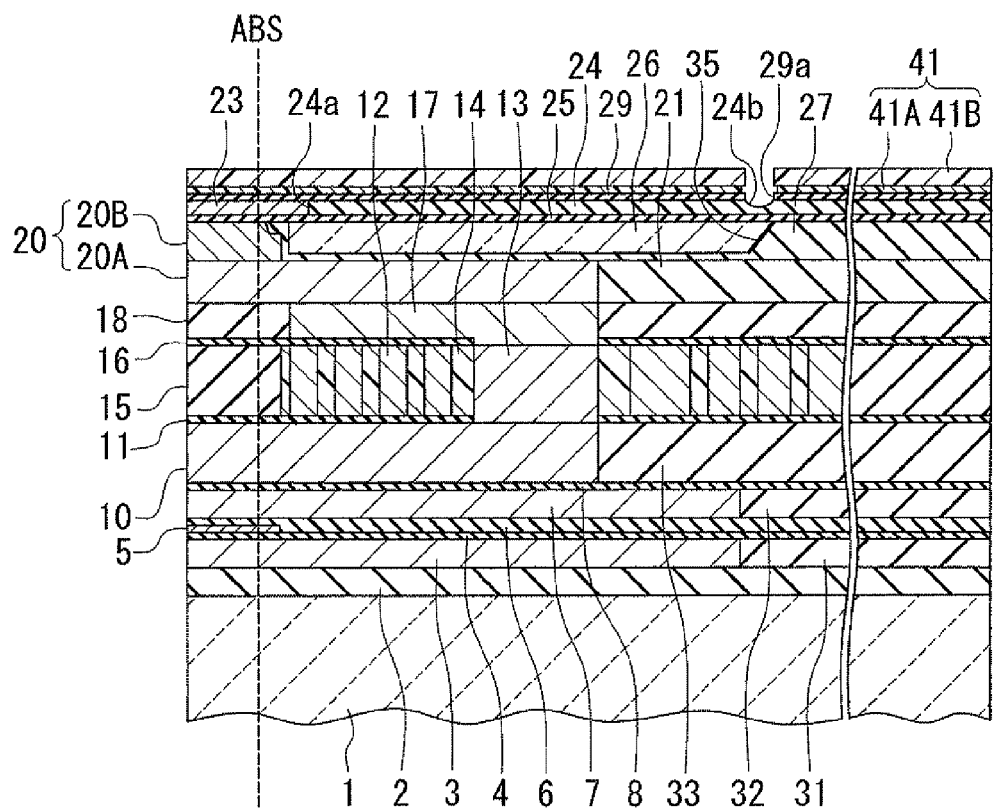
FIG. 16A and FIG. 16B are explanatory diagrams showing a step that follows the step of FIG. 15A and FIG. 15B.
Figure 16B:
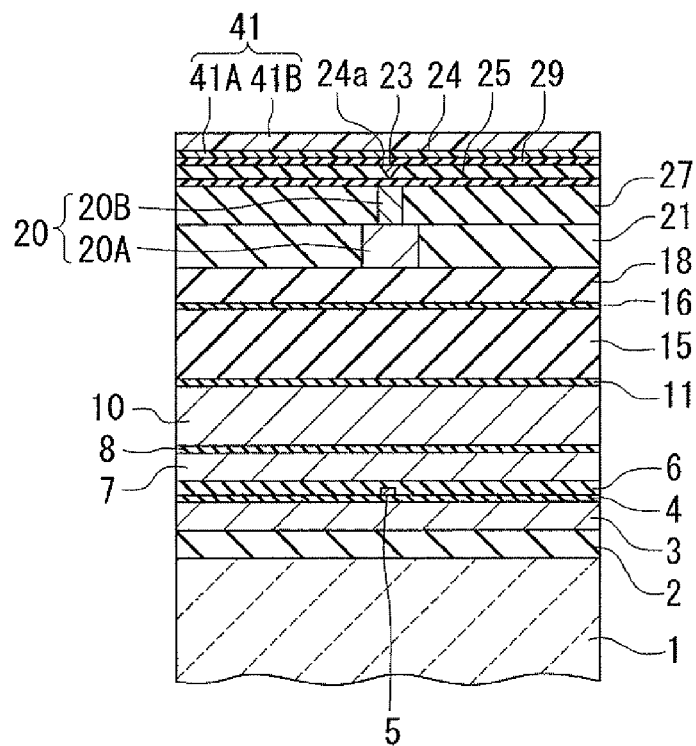

FIG. 16A and FIG. 16B show the next step. In this step, first, a mask 41 is formed on the top surface of the insulating layer 29. The mask 41 has an opening that has a shape corresponding to the planar shape of the convergent lens 30 to be formed later. The mask 41 includes an underlayer 41A lying on the insulating layer 29 and a photoresist layer 41B lying on the underlayer 41A. The underlayer 41A is made of a material that is soluble in a developer, for example. Each of the underlayer 41A and the photoresist layer 41B has an opening that has a shape corresponding to the planar shape of the convergent lens 30 to be formed later. The opening of the underlayer 41A is slightly larger in size than the opening of the photoresist layer 41B. Consequently, as shown in FIG. 16A, the mask 41 is formed into a shape having an undercut.

Next, a portion of the insulating layer 29 exposed from the opening of the mask 41 is etched by, for example, RIE, using the mask 41 as the etching mask. The opening 29a is thereby formed in the insulating layer 29. Next, a portion of the top surface of the initial support layer 24P exposed from the opening of the mask 41 is etched by, for example, RIE, using the mask 41 as the etching mask. The groove 24b is thereby formed in the initial support layer 24P. Here, the initial support layer 24P is taper-etched so that the bottom of the groove 24b forms a concave curved surface. The formation of the groove 24b in the initial support layer 24P makes the initial support layer 24P into the support layer 24.

Figure 17A:
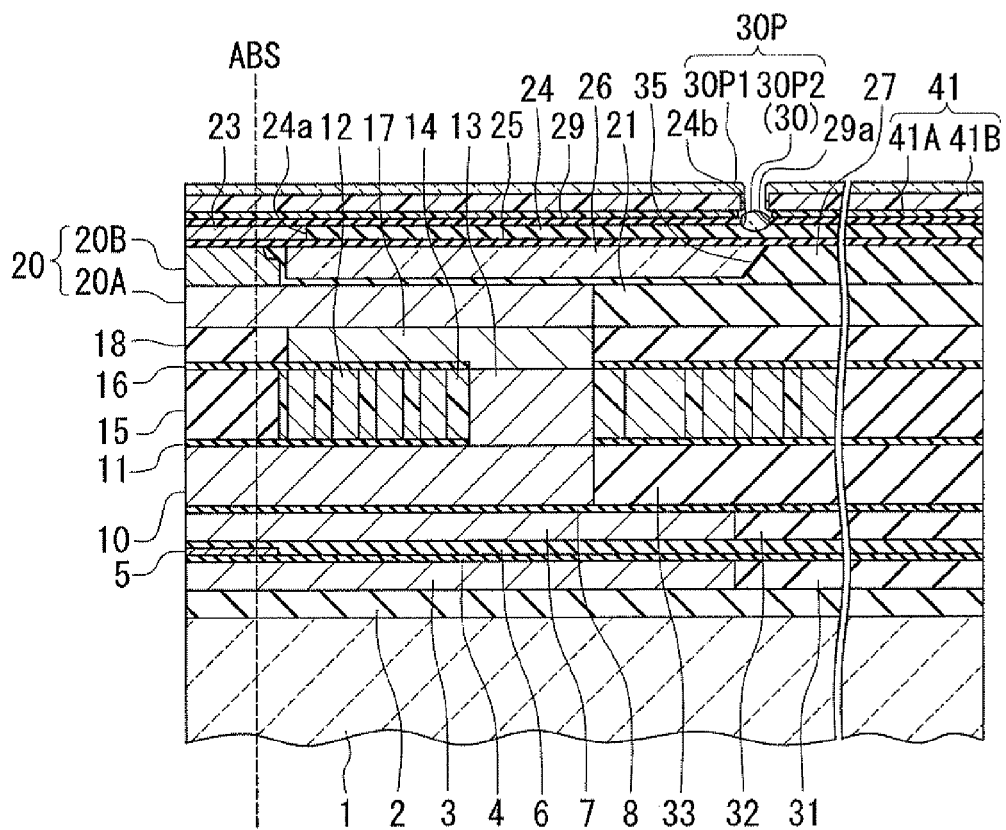
FIG. 17A and FIG. 17B are explanatory diagrams showing a step that follows the step of FIG. 16A and FIG. 16B.
Figure 17B:
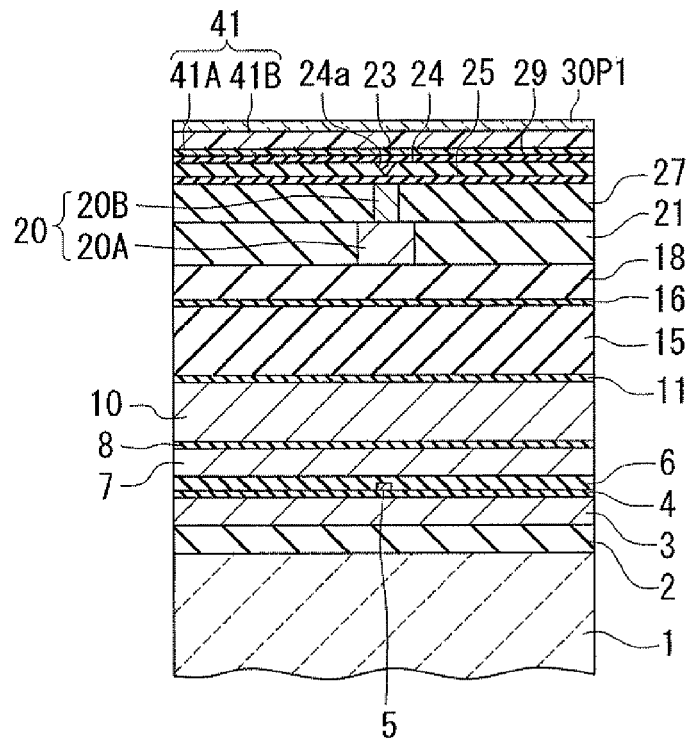

FIG. 17A and FIG. 17B show the next step. In this step, a dielectric layer 30P made of a dielectric material is formed over the entire top surface of the stack with the mask 41 intact. The dielectric layer 30P includes a first portion 30P1 formed on the photoresist layer 41B and a second portion 30P2 formed on the groove 24b. The second portion 30P2 is formed to fill the groove 24b and the opening 29a and to have a top surface that forms a convex curved surface.

Figure 18A:
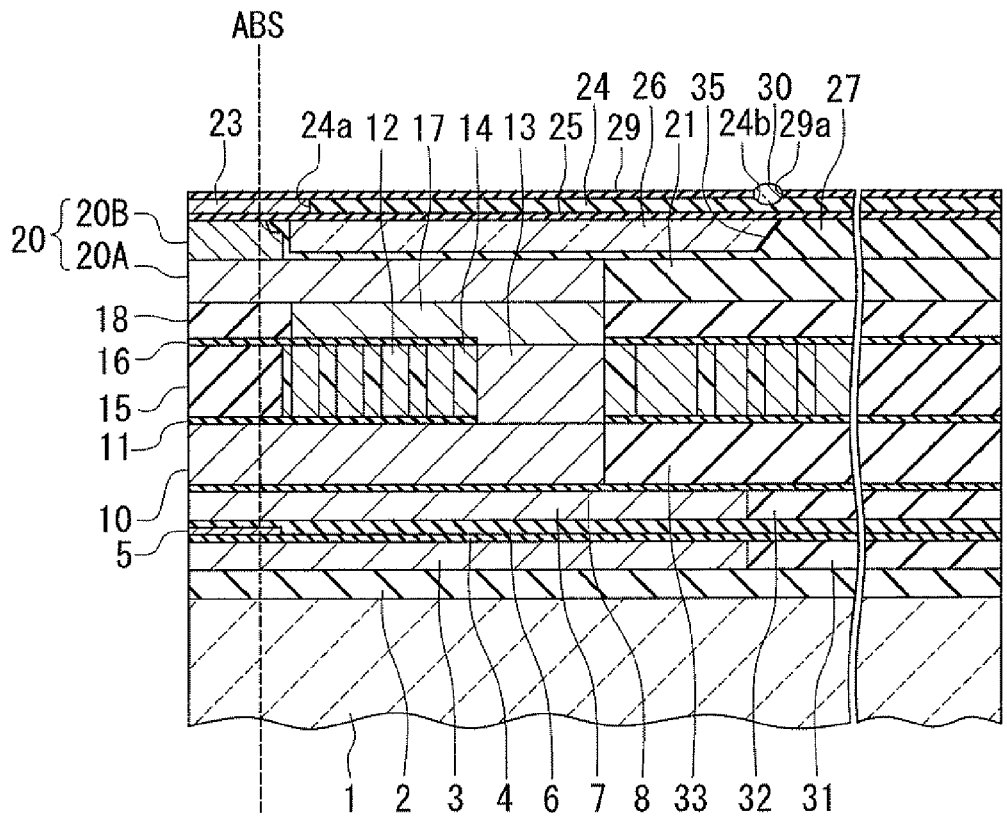
FIG. 18A and FIG. 18B are explanatory diagrams showing a step that follows the step of FIG. 17A and FIG. 17B.
Figure 18B:
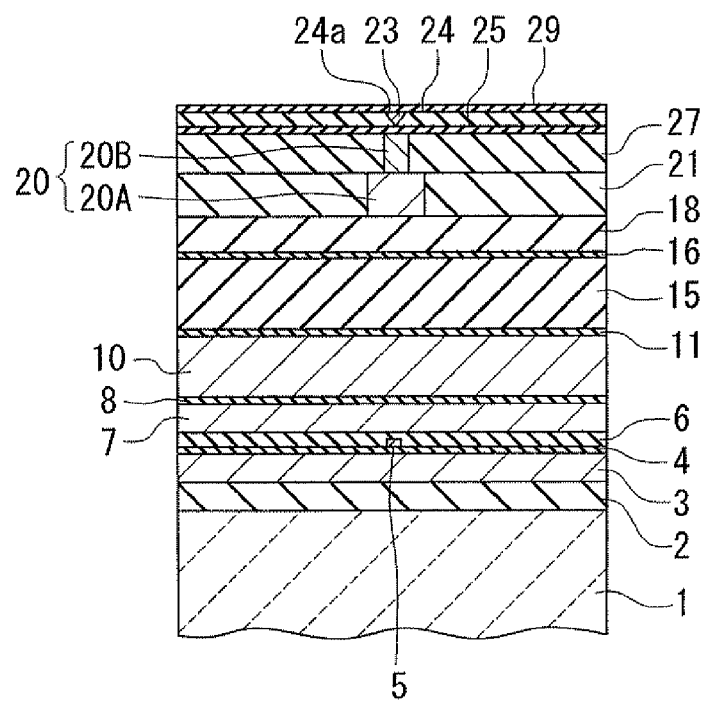

Next, as shown in FIG. 18A and FIG. 18B, the mask 41 is lifted off. This removes the mask 41 and the first portion 30P1 and thereby makes the second portion 30P2 into the convergent lens 30.

Wiring, the terminals 210 and other components are then formed on the top surface of the insulating layer 29. Next, the laser diode 202 with the external mirror 203 fixed thereto is fixed to the top surface of the insulating layer 29. Next, the substrate is cut into sliders, and polishing of the medium facing surface 201a, formation of flying rails, etc. are performed to thereby complete the heat-assisted magnetic recording head 200.

As has been described, the heat-assisted magnetic recording head 200 according to the present embodiment uses the edge-emitting laser diode 202 as the light source for emitting the light to be used for generating near-field light. The laser diode 202 is disposed on the top surface 201c of the slider 201. Specifically, the laser diode 202 is fixed to the slider 201, being arranged so that the bottom surface 202a lying at an end in the direction perpendicular to the plane of the active layer 222 faces the top surface 201c of the slider 201. The bottom surface 202a of the laser diode 202 is parallel to the plane of the active layer 222 and has an area greater than that of the emitting end face 202c. In the present embodiment, it is therefore easy to position the laser diode 202 with respect to the slider 201 with high precision so that the optical axis of the laser light emitted from the emission part 222a is parallel to the top surface 201c of the slider 201. Thus, according to the present embodiment, the optical axis of the laser light emitted from the emission part 222a can be prevented from tilting with respect to a desired direction. According to the present embodiment, it is therefore possible, while using the edge-emitting laser diode 202 having a high optical output as the light source for emitting light to be used for generating near-field light, to align the laser light with the waveguide more easily as compared with the case where the laser light emitted from the emission part 222a is made incident directly on the waveguide.

In the present embodiment, as previously described, the external mirror 203 has the first reference surface 203c that is parallel to the emitting end face 202c and faces the emitting end face 202c, and the second reference surface 203d that is parallel to the bottom surface 202a and faces toward the same direction as the bottom surface 202a does. According to the present embodiment, at least either one of the first reference surface 203c and the second reference surface 203d can be used to align the external mirror 203 with respect to the slider 201 and the laser diode 202 so that the optical axis of the laser light reflected by the reflecting surface 203e will not tilt with respect to a desired direction. Specifically, in the present embodiment, the first reference surface 203c is in contact with the emitting end face 202c of the laser diode 202, whereby the external mirror 203 is aligned with respect to the slider 201 and the laser diode 202 so that the optical axis of the laser light reflected by the reflecting surface 203e will not tilt with respect to a desired direction.

As described above, disposing the laser diode 202 on the top surface 201c of the slider 201 facilitates the alignment of the laser light with the waveguide 26. However, this increases the distance from the emission part of the laser diode to the waveguide as compared with the case where the laser diode is disposed so that the emission part is opposed to the incident end of the waveguide. If the present embodiment included no convergent lens 30, the laser light emitted from the emission part 222a of the laser diode 202 would increase in diameter with increasing distance from the emission part 222a. In such a case, the laser light incident on the waveguide 26 would be so large in diameter that part of the laser light failed to be incident on the waveguide 26. This would reduce the amount of the laser light propagating through the waveguide 26, resulting in a drop in the use efficiency of the laser light to be used to generate near-field light.

In contrast, the heat-assisted magnetic recording head 200 according to the present embodiment includes the convergent lens 30. In the present embodiment, the laser light emitted from the emission part 222a of the laser diode 202 is reflected by the external mirror 203, transmitted through the convergent lens 30, and then passed through the support layer 24 and the interposition layer 25 to enter the waveguide 26. In the present embodiment, the laser light is incident on the waveguide 26 with a diameter smaller than that of the laser light that would be incident on the waveguide 26 without the convergent lens 30. According to the present embodiment, it is therefore possible to prevent the laser light from failing to be incident on the waveguide 26 in part. The present embodiment thus makes it possible to prevent a decrease in the amount of the laser light propagating through the waveguide 26, thereby preventing a drop in the use efficiency of the laser light to be used to generate near-field light.

In the present embodiment, the convergent lens 30 has a bottom surface that forms a convex curved surface in contact with the bottom of the groove 24a. The convergent lens 30 has a refractive index higher than that of the support layer 24. In the present embodiment, the convergent lens 30 therefore exerts the function of converging the laser light at its bottom surface. The convergent lens further has a top surface that forms a convex curved surface. In the present embodiment, the convergent lens 30 therefore exerts the function of converging the laser light also at its top surface.

In the present embodiment, the light transmitted through the convergent lens 30 passes through the support layer 24 and the interposition layer 25, and enters the waveguide 26 from the top surface 26c to reach the rear end surface 26b. The light is then reflected by the internal mirror 35 so as to travel through the waveguide 26 toward the medium facing surface 201a (the front end surface 26a). If there is no convergent lens 30, the laser light incident on the internal mirror 35 becomes so large in diameter that part of the laser light fails to be reflected by the internal mirror 35. This can decrease the amount of the laser light that is reflected by the internal mirror 35 to travel in a desired direction. According to the present embodiment, in contrast, the laser light is reflected by the internal mirror 35 with a diameter smaller than that of the laser light that would be reflected by the internal mirror 35 without the convergent lens 30. According to the present embodiment, it is therefore possible to prevent a drop in the amount of the laser light that is reflected by the internal mirror 35 to travel in the desired direction.

In the present embodiment, the laser diode 202 is fixed to the slider 201, being arranged so that the bottom surface 202a lying at an end in the direction perpendicular to the plane of the active layer 222 faces the top surface 201c of the slider 201. The distance D1 between the bottom surface 202a and the emission part 222a of the laser diode 202 is smaller than the distance D2 between the top surface 202b and the emission part 222a of the laser diode 202. As mentioned previously, the laser light emitted from the emission part 222a of the laser diode 202 increases in diameter with increasing distance from the emission part 222a. If the distance D1 is greater than the distance D2, the path of the laser light from the emission part 222a to the convergent lens 30 can be so long that part of the laser light is no longer incident on the convergent lens 30. In such a case, part of the laser light fails to enter the wave guide 26 and fails to be reflected by the internal mirror 35. This results in a drop in the amount of the laser light propagating through the waveguide 26. In contrast, according to the present embodiment, the path of the laser light from the emission part 222a to the convergent lens 30 can be made shorter than in the case where the distance D1 is greater than the distance D2. According to the present embodiment, it is therefore possible to reduce the diameter of the laser light that is incident on the convergent lens 30. Consequently, according to the present embodiment, it is possible to prevent the laser light from failing to be incident on the internal mirror 35 in part, and thereby prevent a drop in the amount of the laser light propagating through the waveguide 26.

In the present embodiment, the external mirror 203 has the first reference surface 203c that is parallel to the emitting end face 202c and faces the emitting end face 202c, and the second reference surface 203d that is parallel to the bottom surface 202a and faces toward the same direction as the bottom surface 202a does. The reflecting surface 203e of the external mirror 203 connects the first reference surface 203c and the second reference surface 203d to each other, the first reference surface 203c facing the emitting end face 202c, the second reference surface 203d facing toward the same direction as the bottom surface 202a does. The reflecting surface 203e is thus close to both the emitting end face 202c and the slider 201. According to the present embodiment, it is therefore possible to reduce both the distance from the emission part 222a of the laser diode 202 to the reflecting surface 203e and the distance from the reflecting surface 203e to the slider 201 (the convergent lens 30). Consequently, according to the present embodiment, it is possible to reduce the diameter of the laser light that is incident on the convergent lens 30.

As has been described, according to the present embodiment, easy alignment of the laser light with the waveguide 26 is made possible by disposing the laser diode 202 on the top surface 201c of the slider 201. Moreover, the provision of the convergent lens 30 eliminates the problem that is ascribable to an increased distance from the emission part 222a of the laser diode 202 to the waveguide 26.

Other effects of the present embodiment will now be described. In the present embodiment, the opposed portion 26g of the outer surface of the waveguide 26 is opposed to a part of the edge part 23f of the near-field light generating element 23 and its vicinity with the interposition layer 25 interposed therebetween. In the present embodiment, evanescent light occurs from the interposition layer 25 based on the light propagating through the waveguide 26. Based on this evanescent light, surface plasmons are excited on the near-field light generating element 23. The surface plasmons then propagate to the near-field light generating part 23g, and the near-field light generating part 23g generates near-field light based on the surface plasmons. According to the present embodiment, it is possible to increase the efficiency of conversion of the light propagating through the waveguide 26 into the near-field light, as compared with the case where a plasmon antenna is directly irradiated with laser light to produce near-field light.

According to the present embodiment, it is possible suppress a temperature rise of the near-field light generating element 23 because the near-field light generating element 23 is not directly irradiated with the laser light propagating through the waveguide 26. In the present embodiment, the length $H_{P4}$ of the near-field light generating element 23 in the direction perpendicular to the medium facing surface 201a is greater than the length $T_{P4}$ of the first end face 23a in the direction perpendicular to the top surface 1a of the substrate 1. Thus, the near-field light generating element 23 of the present embodiment is greater in volume than a conventional plasmon antenna in which the length in the direction perpendicular to the medium facing surface 201a is smaller than the length in the direction perpendicular to the top surface 1a of the substrate 1. This also contributes to suppression of a temperature rise of the near-field light generating element 23. Consequently, according to the present embodiment, it is possible to prevent the near-field light generating element 23 from protruding from the medium facing surface 201a.

In the present embodiment, as shown in FIG. 2, the laser diode 202, the external mirror 203, the internal mirror 35, the convergent lens 30, and the waveguide 26 are arranged so that the direction of travel of the laser light L1 emitted from the emission part 222a and the direction of travel of the laser light L4 reflected by the internal mirror 35 are orthogonal to each other as viewed from above the top surface 201c of the slider 201. According to the present embodiment, such arrangement allows the direction of polarization (the direction of oscillation of the electric field) of the laser light L4 reflected by the internal mirror 35 to be orthogonal to the direction of polarization of the laser light L1 emitted from the emission part 222a, as shown in FIG. 2. Consequently, the present embodiment makes it possible that the direction of polarization of the laser light propagating through the waveguide 26 is set to such a direction that surface plasmons of high intensity can be generated on the near-field light generating element 23, i.e., the direction perpendicular to the opposed portion 26g, while using a typical laser diode that emits laser light of TE mode as the laser diode 202.

In the heat-assisted magnetic recording head 200 according to the present embodiment, the near-field light generating element 23 is located farther from the top surface 1a of the substrate 1 than is the second layer 20B of the magnetic pole 20, and the waveguide 26 is located farther from the top surface 1a of the substrate 1 than is the first layer 20A of the magnetic pole 20. The light emitted from the laser diode 202 disposed above the waveguide 26 is reflected by the internal mirror 35 so as to travel through the waveguide 26 toward the medium facing surface 201a.

A case will now be considered where a near-field light generating element and a waveguide are disposed closer to the top surface 1a of the surface 1 than is the magnetic pole 20. In such a case, since the magnetic pole 20 lies above the near-field light generating element and the waveguide, the optical path from the laser diode to the waveguide becomes longer and the energy loss of the light increases if the laser diode is disposed above the waveguide as in the present embodiment. The longer optical path from the laser diode to the waveguide also makes it harder to precisely position the laser diode and the waveguide, thus often resulting in energy loss of the light due to misalignment between the laser diode and the waveguide.

In contrast, the present embodiment allows shortening the optical path from the laser diode 202 to the waveguide 26, thus making it possible to guide the light from the laser diode 202 to the opposed portion 26g of the outer surface of the waveguide 26 through a shorter path. According to the present embodiment, it is therefore possible to reduce the energy loss of the light. Furthermore, the present embodiment allows the laser diode 202 and the waveguide 26 to be put close to each other, which facilitates precise positioning of the laser diode 202 and the waveguide 26. Consequently, according to the present embodiment, it is possible to reduce the energy loss of the light resulting from misalignment between the laser diode 202 and the waveguide 26.

In the present embodiment, the interposition layer 25 having a refractive index lower than that of the waveguide 26 is disposed on the top surface of the waveguide 26 on which the laser light is to be incident. Light that is incident on the interface between the waveguide 26 and the interposition layer 25 from the side of the waveguide 26 at incident angles greater than or equal to the critical angle is thus totally reflected at the interface. This can prevent the laser light that is emitted from the laser diode 202 to pass through the convergent lens 30, the support layer 24 and the interposition layer 25 and enter the waveguide 26 from again passing through the interposition layer 25, the support layer 24 and the convergent lens 30 to return to the laser diode 202. Consequently, according to the present embodiment, it is possible to increase the use efficiency of the laser light and to prevent the laser diode 202 from being damaged by laser light that returns to the laser diode 202.

From the foregoing, the present embodiment makes it possible to increase the use efficiency of the light used for generating near-field light in the heat-assisted magnetic recording head.

MODIFICATION EXAMPLES

Figure 19:
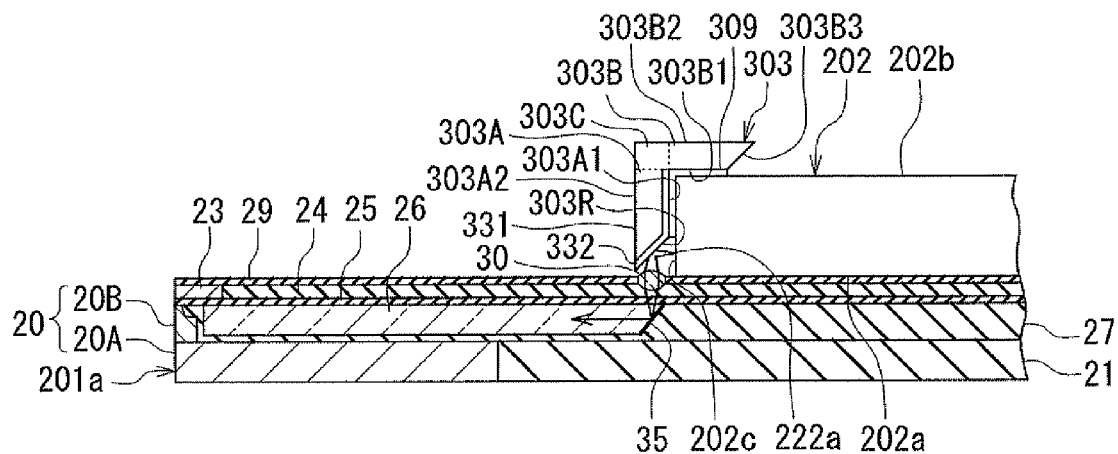
FIG. 19 is a cross-sectional view showing a laser diode, external mirror, internal mirror, and convergent lens of a first modification example of the first embodiment of the invention.

A description will now be given of first to fifth modification examples of the present embodiment. Initially, a first modification example will be described with reference to FIG. 19. FIG. 19 is a cross-sectional view showing the laser diode, the external mirror, the internal mirror, and the convergent lens of the first modification example. The heat-assisted magnetic recording head of the first modification example is provided with an external mirror 303 shown in FIG. 19 instead of the external mirror 203 of the heat-assisted magnetic recording head 200 shown in FIG. 1 to FIG. 3.

As shown in FIG. 19, the external mirror 303 includes: a first to-be-fixed part 303A disposed along the emitting end face 202c of the laser diode 202; a second to-be-fixed part 303B disposed along the top surface 202b of the laser diode 202; and a coupling part 303C that couples the first to-be-fixed part 303A and the second to-be-fixed part 303B to each other. The first to-be-fixed part 303A and the second to-be-fixed part 303B are both shaped like a plate.

The first to-be-fixed part 303A has: a first surface 303A1 that faces the emitting end face 202c; a second surface 303A2 opposite to the first surface 303A1; and a reflecting surface 303R that lies at an end opposite to the coupling part 303C and connects the first surface 303A1 and the second surface 303A2 to each other. The second surface 303A2 is parallel to the first surface 303A1. The reflecting surface 303R reflects the laser light emitted from the emission part 222a so that the reflected laser light is incident on the convergent lens 30. The reflecting surface 303R is oblique with respect to the first surface 303A1 and continuous with the first surface 303A1. The reflecting surface 303R forms an angle of 45° with respect to the first surface 303A1.

The second to-be-fixed part 303B has: a first surface 303B1 that faces the top surface 202b; a second surface 303B2 opposite to the first surface 303B1; and an end face 303B3 that lies at an end opposite to the coupling part 303C and connects the first surface 303B1 and the second surface 303B2 to each other. The second surface 303B2 is parallel to the first surface 303B1. The first surface 303B1 of the second to-be-fixed part 303B is orthogonal to the first surface 303A1 of the first to-be-fixed part 303A. The end face 303B3 is oblique with respect to the first surface 303B1 and continuous with the first surface 303B1. The end face 303B3 forms an angle of 45° with respect to the first surface 303B1, and is parallel to the reflecting surface 303R.

The external mirror 303 includes a main body 331, and a metal film 332 that adheres to the main body 331 to form the reflecting surface 303R. The overall shape of the main body 331 is almost the same as that of the external mirror 303. The first surface 303A1 and the reflecting surface 303R are formed by the surface of the metal film 332.

The main body 331 may be made of an insulating material such as glass or resin, a semiconductor material such as silicon, or a metal material. The metal film 332 is made of a metal such as Au, Cu, Cr, Ag, or Al. The metal film 332 has a thickness of 50 to 200 nm or so.

As shown in FIG. 19, the external mirror 303 is fixed to the laser diode 202 by bonding the first surface 303A1 of the first to-be-fixed part 303A to the emitting end face 202c of the laser diode 202 and bonding the first surface 303B1 of the second to-be-fixed part 303B to the top surface 202b of the laser diode 202, using an insulating adhesive. The reference numeral 309 in FIG. 19 indicates an adhesive layer formed by the adhesive. The external mirror 303 is insulated from the laser diode 202 by the adhesive layer 309. The reflecting surface 303R is located in front of the emission part 222a.

In the first modification example, the external mirror 303 reflects the laser light emitted from the emission part 222a of the laser diode 202 so that the reflected laser light is incident on the convergent lens 30. The external mirror 303 of the first modification example is alignable with respect to the laser diode 202 so that the optical axis of the laser light reflected by the reflecting surface 303R will not tilt with respect to a desired direction. Furthermore, the external mirror 303 of the first modification example makes it possible to reduce both the distance from the emission part 222a to the reflecting surface 303R and the distance from the reflecting surface 303R to the slider 201 (the convergent lens 30).

Figure 20:
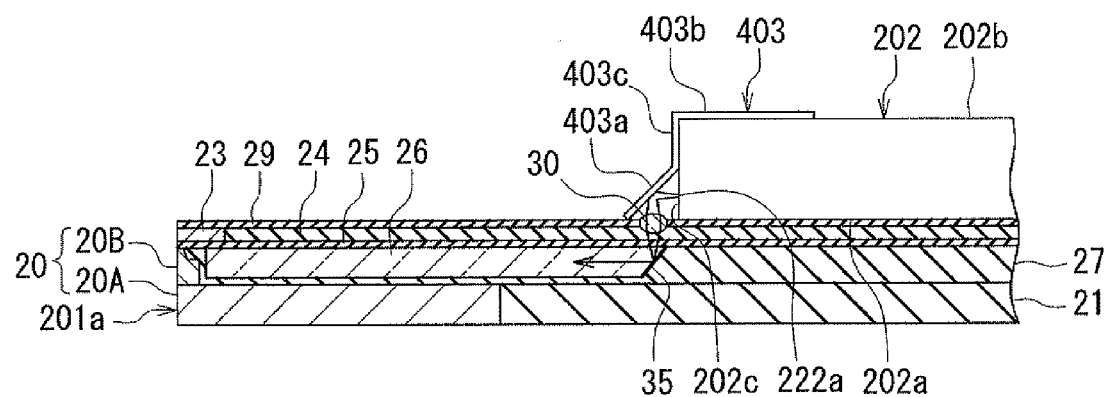
FIG. 20 is a cross-sectional view showing a laser diode, external mirror, internal mirror, and convergent lens of a second modification example of the first embodiment of the invention.

A second modification example of the present embodiment will now be described with reference to FIG. 20. FIG. 20 is a cross-sectional view showing the laser diode, the external mirror, the internal mirror, and the convergent lens of the second modification example. The heat-assisted magnetic recording head of the second modification example is provided with an external mirror 403 shown in FIG. 20 instead of the external mirror 303 of the first modification example shown in FIG. 19.

As shown in FIG. 20, the external mirror 403 includes a reflecting part 403a and to-be-fixed parts 403b and 403c that are each shaped like a plate. The to-be-fixed parts 403b and 403c are coupled to each other to form an angle of 90° therebetween. The reflecting part 403a is coupled to an end of the to-be-fixed part 403c so as to form an angle of 135° with respect to the to-be-fixed part 403c. The to-be-fixed part 403b is coupled to the opposite end of the to-be-fixed part 403c. The to-be-fixed part 403b is fixed to the top surface 202b while the to-be-fixed part 403c is fixed to the emitting end face 202c, whereby the external mirror 403 is fixed to the laser diode 202. The reflecting part 403a is located in front of the emission part 222a. One of the surfaces of the reflecting part 403a that is closer to the emission part 222a constitutes a reflecting surface that reflects the laser light emitted from the emission part 222a so that the reflected laser light is incident on the convergent lens 30. The normal to the reflecting surface forms an angle of 45° with respect to the direction of travel of the laser light emitted from the emission part 222a.

The external mirror 403 can be formed by, for example, molding a body out of an insulating material such as resin or glass, and forming a metal film on at least a part of the body that is to make the reflecting surface by vapor deposition, sputtering, or the like. The part of the body that is to make the reflecting surface may be polished before the formation of the metal film. It is thereby possible to prevent the reflecting surface from being rounded at the portion near the border between the reflecting part 403a and the to-be-fixed part 403c. This makes it possible that the laser light emitted from the emission part 222a is reflected by the reflecting surface at a point closer to the border between the reflecting part 403a and the to-be-fixed part 403c. Consequently, the path of the laser light from the emission part 222a to the reflecting surface can be reduced to prevent the diameter of the laser light reflected by the reflecting surface from being too large.

Figure 21:
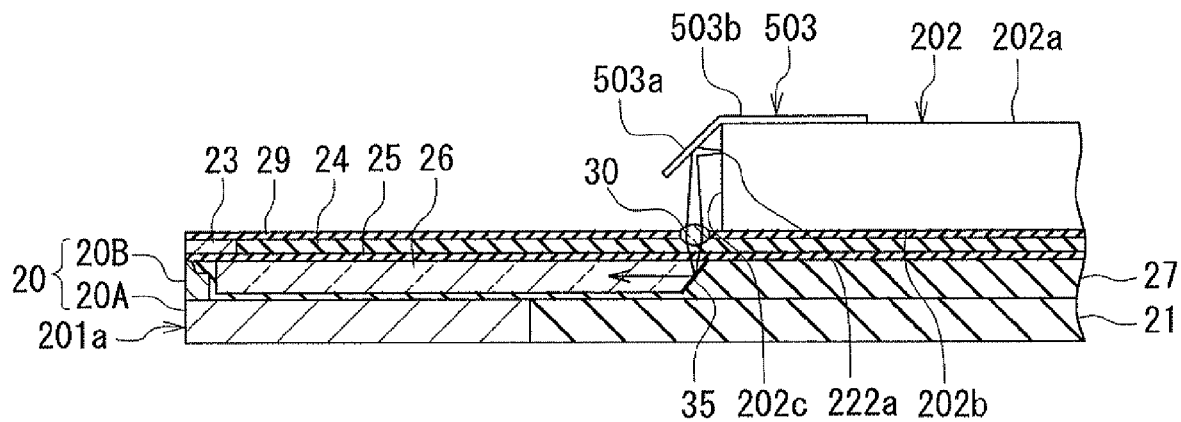
FIG. 21 is a cross-sectional view showing a laser diode, external mirror, internal mirror, and convergent lens of a third modification example of the first embodiment of the invention.

A third modification example of the present embodiment will now be described with reference to FIG. 21. FIG. 21 is a cross-sectional view showing the laser diode, the external mirror, the internal mirror, and the convergent lens of the third modification example. The heat-assisted magnetic recording head of the third modification example is provided with an external mirror 503 instead of the external mirror 403 of the second modification example shown in FIG. 20.

In the third modification example, as shown in FIG. 21, the laser diode 202 is fixed to the top surface 201c of the slider 201 upside down as compared with the laser diode 202 of the second modification example shown in FIG. 20. More specifically, the laser diode 202 of the third modification example is fixed to the slider 201, being positioned in such a manner that the top surface 202b of the laser diode 202 of the second modification example shown in FIG. 20 faces the top surface 201c of the slider 201. The laser diode 202 of the third modification example is such that the bottom surface 202a of the laser diode 202 of the second modification example shown in FIG. 20 is turned into the top surface. For this reason, the top surface of the laser diode 202 of the third modification example will hereinafter be referred to as a top surface 202a.

The external mirror 503 includes a reflecting part 503a and a to-be-fixed part 503b that are each shaped like a plate and that are coupled to each other to form an angle of 135° therebetween. The to-be-fixed part 503b is fixed to the top surface 202a, whereby the external mirror 503 is fixed to the laser diode 202. The reflecting part 503a is located in front of the emission part 222a. One of the surfaces of the reflecting part 503a that is closer to the emission part 222a constitutes a reflecting surface that reflects the laser light emitted from the emission part 222a so that the reflected laser light is incident on the convergent lens 30. The normal to the reflecting surface forms an angle of 45° with respect to the direction of travel of the laser light emitted from the emission part 222a. The external mirror 503 can be formed by, for example, molding a body out of an insulating material such as resin or glass, and forming a metal film on at least a part of the body that is to make the reflecting surface by vapor deposition, sputtering, or the like.

In each of the examples shown in FIG. 19 to FIG. 21, the laser diode 202, the external mirror (303, 403 or 503), the internal mirror 35, the convergent lens 30, and the waveguide 26 are arranged so that the direction of travel of the laser light emitted from the emission part 222a and the direction of travel of the laser light reflected by the internal mirror 35 are parallel to each other. In the first to third modification examples, however, the laser diode 202, the external mirror (303, 403 or 503), the internal mirror 35, the convergent lens 30, and the waveguide 26 may be arranged so that the direction of travel of the laser light emitted from the emission part 222a and the direction of travel of the laser light reflected by the internal mirror 35 are orthogonal to each other as viewed from above the top surface 201c of the slider 201.

Figure 22:
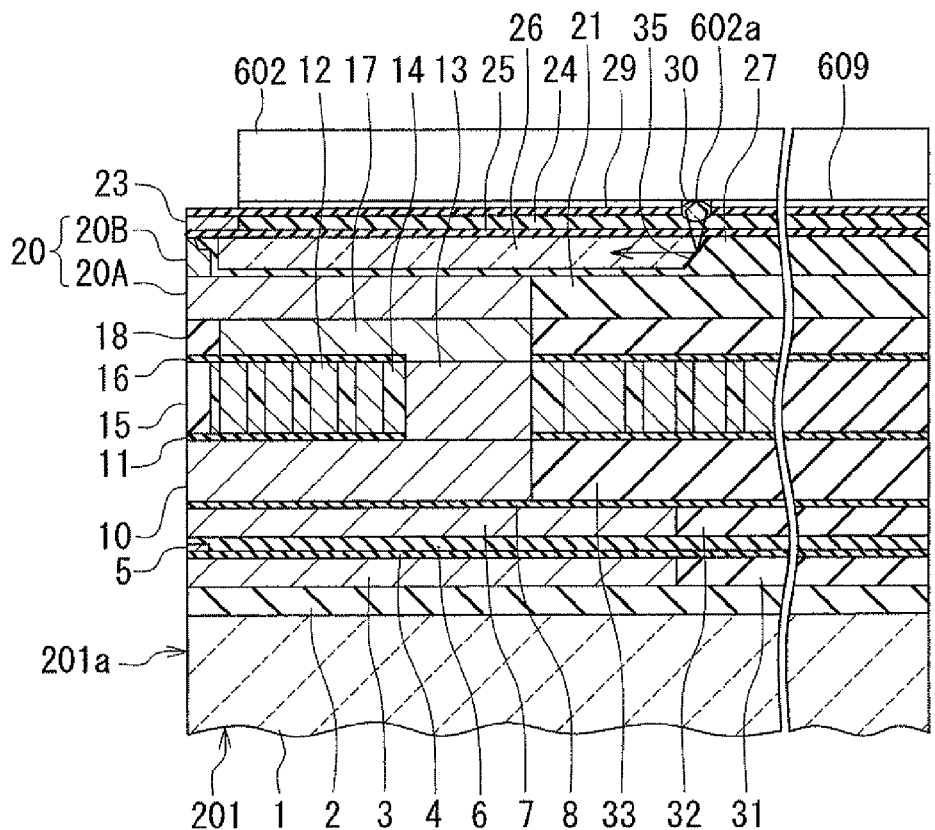
FIG. 22 is a cross-sectional view showing a laser diode, internal mirror, and convergent lens of a fourth modification example of the first embodiment of the invention.

A fourth modification example of the present embodiment will now be described with reference to FIG. 22. FIG. 22 is a cross-sectional view showing the laser diode, the internal mirror, and the convergent lens of the fourth modification example. The heat-assisted magnetic recording head of the fourth modification example is provided with a surface-emitting laser diode 602 shown in FIG 22 instead of the diode 202 and the external mirror 203 of the heat-assisted magnetic recording head 200 shown in FIG. 1 to FIG. 3.

As shown in FIG. 22, the laser diode 602 is fixed to the top surface 201c of the slider 201 with an adhesive. The reference numeral 609 in FIG. 22 indicates an adhesive layer formed by the adhesive. The laser diode 602 has an emission part 602a on its bottom surface, and emits laser light downward from the emission part 602a. The laser light emitted from the emission part 602a passes through the convergent lens 30, the support layer 24 and the interposition layer 25, and enters the waveguide 26 from the top surface 26c to reach the rear end face 26b, where the laser light is reflected by the internal mirror 35 so as to travel through the waveguide 26 toward the medium facing surface 201a (the front end face 26a). While FIG. 22 shows that the emission part 602a is in contact with the convergent lens 30, the emission part 602a need not be in contact with the convergent lens 30.

The fourth modification example allows the laser light emitted from the emission part 602a to be made incident directly on the convergent lens 30 without reflection by the external mirror. The fourth modification example thus allows shortening of the optical path from the laser diode 602 to the waveguide 26, and accordingly makes it possible to guide the light from the laser diode 602 to the opposed portion 26g of the outer surface of the waveguide 26 through a shorter path.

According to the fourth modification example, it is therefore possible to reduce the energy loss of the light. Furthermore, the fourth modification example allows the laser diode 602 and the waveguide 26 to be put close to each other, which facilitates precise positioning of the laser diode 602 and the waveguide 26. Consequently, according to the fourth modification example, it is possible to reduce the energy loss of the light resulting from misalignment between the laser diode 602 and the waveguide 26.

The surface-emitting laser diode 602 may be a vertical cavity surface-emitting laser (VCSEL) or a photonic crystal surface-emitting laser. The photonic crystal surface-emitting laser is a laser diode in which a photonic crystal having a cyclic refractive index distribution of the order of light wavelengths is used as the laser resonator. By using a photonic crystal surface-emitting laser as the laser diode 602, it is possible to emit laser light that can be focused into a size smaller than the light's diffraction limit from the emission part 602a. This can make the diameter of the laser light incident on the waveguide 26 and the diameter of the laser light reflected by the internal mirror 35 even smaller.

Figure 23:
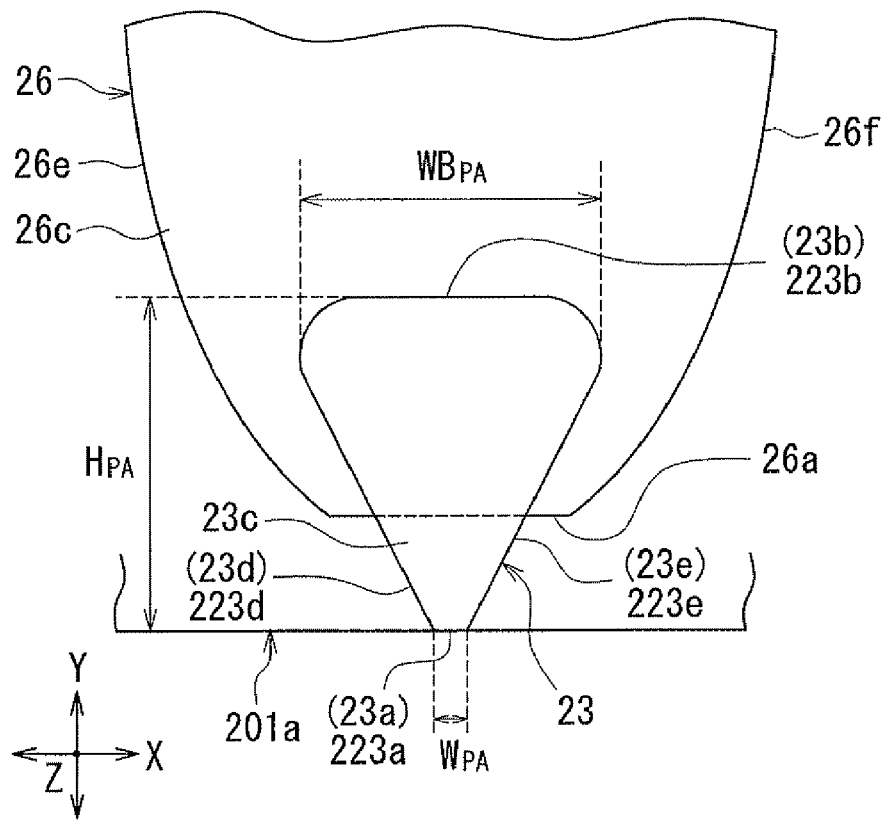
FIG. 23 is a plan view showing a part of a waveguide and a near-field light generating element of a fifth modification example of the first embodiment of the invention.
Figure 24:
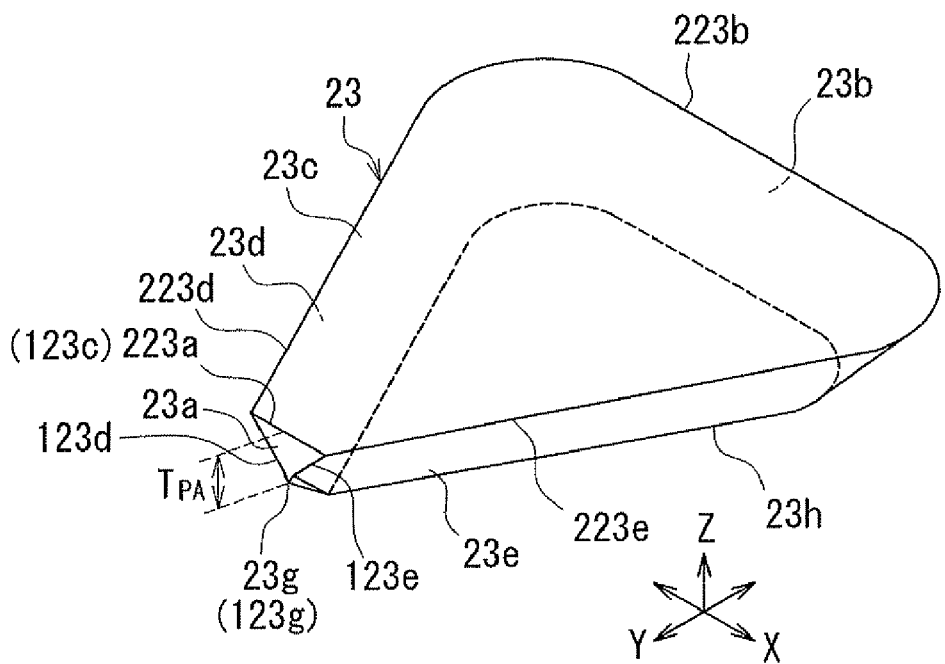
FIG. 24 is a perspective view of the near-field light generating element of FIG. 23.

A fifth modification example of the present embodiment will now be described with reference to FIG. 23 and FIG. 24. FIG. 23 is a plan view showing a part of the waveguide 26 and the near-field light generating element 23 of the fifth modification example. FIG. 24 is a perspective view of the near-field light generating element 23 shown in FIG. 23. In the near-field light generating element 23 of the fifth modification example, the side surfaces 23d and 23e have their respective portions that decrease in distance from each other in the track width direction with decreasing distance to the medium facing surface 201a. The corner portion between the side surface 23d and the second end face 23b and the corner portion between the side surface 23e and the second end face 23b are both rounded. In the fifth modification example, in particular, the side surfaces 23d and 23e excluding the above-mentioned two corner portions decrease in distance from each other in the track width direction with decreasing distance to the medium facing surface 201a.

The top surface 23c has a first edge 223a that is located at the top end of the first end face 23a, a second edge 223b that is located at the top end of the second end face 23b, a third edge 223d that is located at the top end of the side surface 23d, and a fourth edge 223e that is located at the top end of the side surface 23e. The third edge 223d and the fourth edge 223e have their respective portions that decrease in distance from each other in a direction parallel to the first edge 223a with decreasing distance to the first edge 223a. The corner portion between the second edge 223b and the third edge 223d and the corner portion between the second edge 223b and the fourth edge 223e are both rounded. In the fifth modification example, in particular, the third edge 223d and the fourth edge 223e excluding the above-mentioned two corner portions decrease in distance from each other in the direction parallel to the first edge 223a with decreasing distance to the first edge 223a.

The near-field light generating element 23 of the fifth modification example has a bottom surface 23h that is closer to the top surface 1a of the substrate 1. A part of the top surface 26c of the waveguide 26 is opposed to a part of the bottom surface 23h of the near-field light generating element 23 with the interposition layer 25 interposed therebetween. FIG. 23 shows an example in which the front end face 26a of the waveguide 26 is located away from the medium facing surface 201a. However, the front end face 26a may be located in the medium facing surface 201a.

As shown in FIG. 24, the near-field light generating element 23 of the fifth modification example is configured so that an area near the first end face 23a (hereinafter, referred to as front end vicinity area) has a bottom end that gets farther from the top surface 1a of the substrate 1 with decreasing distance to the first end face 23a. Only in the front end vicinity area of the near-field light generating element 23, each of the side surfaces 23d and 23e includes an upper part and a lower part that are continuous with each other, and the angle formed between the lower part of the side surface 23d and the lower part of the side surface 23e is smaller than that formed between the upper part of the side surface 23d and the upper part of the side surface 23e. In the area other than the front end vicinity area of the near-field light generating element 23, the side surfaces 23d and 23e are each planar or almost planar in shape.

The first end face 23a includes: a first side 123d that is located at an end of the first side surface 23d; a second side 123e that is located at an end of the second side surface 23e; a third side 123c that is located at an end of the top surface 23c; and a pointed tip 123g that is formed by contact of the first side 123d and the second side 123e with each other and constitutes the near-field light generating part 23g. Specifically, the near-field light generating part 23g refers to the pointed tip 123g and its vicinity in the end face 23a.

The first side 123d includes an upper part and a lower part that are continuous with each other. The second side 123e includes an upper part and a lower part that are continuous with each other. The angle formed between the lower part of the first side 123d and the lower part of the second side 123e is smaller than the angle formed between the upper part of the first side 123d and the upper part of the second side 123e.

As shown in FIG. 23, the length of the near-field light generating element 23 in the direction perpendicular to the medium facing surface 201a will be denoted by the symbol $H_{P4}$; the width of the first end face 23a at its top edge will be denoted by the symbol $W_{P4}$; and the maximum width of the near-field light generating element 23 in the track width direction (the X direction) will be denoted by the symbol $WB_{P4}$. As shown in FIG. 24, the length of the first end face 23a in the direction perpendicular to the top surface 1a of the substrate 1 will be denoted by the symbol $T_{P4}$. The length $H_{P4}$ of the near-field light generating element 23 in the direction perpendicular to the medium facing surface 201a is greater than the length $T_{P4}$ of the first end face 23a in the direction perpendicular to the top surface 1a of the substrate 1. $W_{P4}$ falls within the range of 50 to 350 nm, for example. $T_{P4}$ falls within the range of 60 to 350 nm, for example. $H_{P4}$ falls within the range of 0.25 to 2.5 µm, for example. $WB_{P4}$ falls within the range of 0.25 to 2.5 µm, for example.

The fifth modification example allows an increase in area of the opposed portion of the waveguide 26 opposed to a part of the coupling portion (a part of the bottom surface 23h) of the outer surface of the near-field light generating element 23. Consequently, it is possible to excite more surface plasmons on the coupling portion (the bottom surface 23h) of the near-field light generating element 23. In the near-field light generating element 23 of the fifth modification example, the corner portion between the side surface 23d and the second end face 23b and the corner portion between the side surface 23e and the second end face 23b are both rounded. This can prevent near-field light from occurring from these corner portions. In the fifth modification example, the side surfaces 23d and 23e of the near-field light generating element 23, excluding the foregoing two corner portions, decrease in distance from each other in the track width direction with decreasing distance to the medium facing surface 201a. This configuration can concentrate surface plasmons excited on the bottom surface 23h while the surface plasmons propagate to the near-field light generating part 23g. According to the fifth modification example, it is therefore possible to concentrate more surface plasmons at the near-field light generating part 23g of pointed shape.

[Second Embodiment]

A heat-assisted magnetic recording head according to a second embodiment of the invention will now be described. The heat-assisted magnetic recording head according to the present embodiment has a configuration the same as the configuration according to the first embodiment. In the present embodiment, the convergent lens 30 is made of a thermoplastic resin that transmits the laser light emitted from the laser diode 202. For example, the thermoplastic resin may be a polyimide resin that has a high transmittance to the foregoing laser light. The polyimide resin has a refractive index of 1.55 to 1.70 or so, for example. In the case of forming the convergent lens 30 of the polyimide resin, the support layer 24 is formed of a dielectric material that has a refractive index lower than the refractive index of the polyimide resin. An example of such a material is $SiO_2$ which has a refractive index of approximately 1.46.

Reference is now made to FIG. 25A to FIG. 28A and FIG. 25B to FIG. 28B to describe a method of manufacturing the heat-assisted magnetic recording head according to the present embodiment. FIG. 25A to FIG. 28A each show a cross section of a stack of layers in the process of manufacturing the heat-assisted magnetic recording head, the cross section being perpendicular to the medium facing surface 201a and the top surface 1a of the substrate 1. In FIG. 25A to FIG. 28A, the symbol "ABS" indicates the position where the medium facing surface 201a is to be formed. FIG. 25B to FIG. 28B show cross sections at the position ABS of FIG. 25A to FIG. 28A, respectively.

The steps of the method of manufacturing the heat-assisted magnetic recording head according to the present embodiment are the same as those of the method according to the first embodiment up to the step of forming the insulating layer 29 as shown in FIG. 15A and FIG. 15B.

Figure 25A:
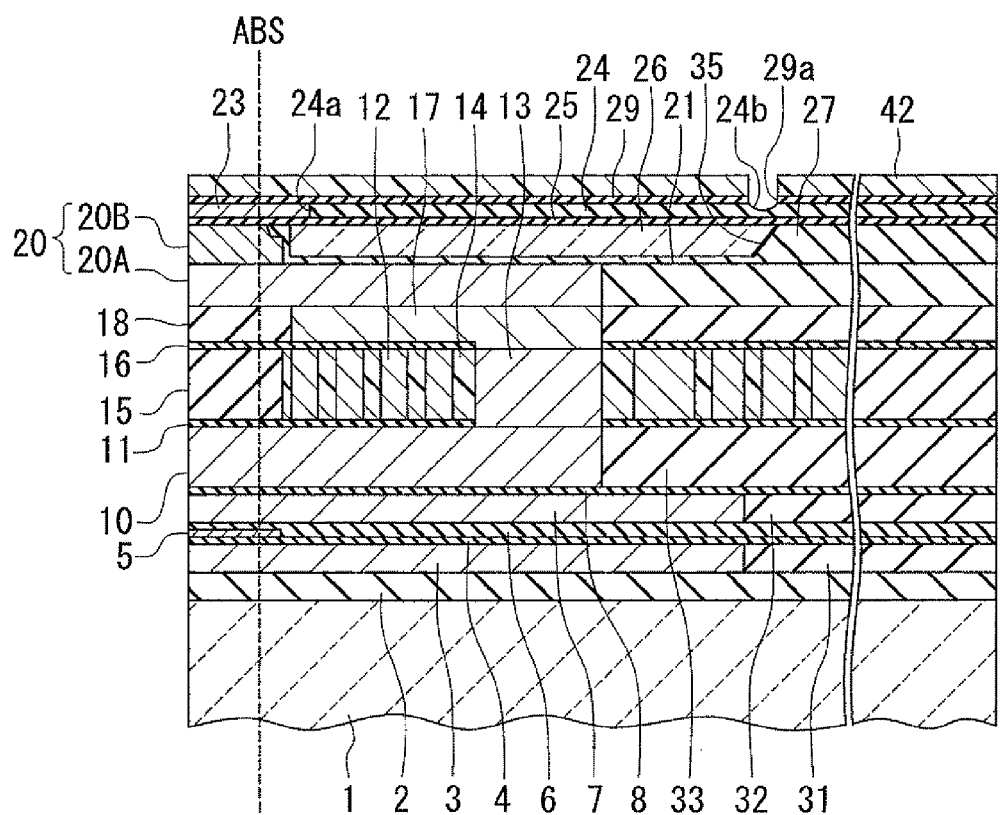
FIG. 25A and FIG. 25B are explanatory diagram showing a step of a method of manufacturing a heat-assisted magnetic recording head according to a second embodiment of the invention.
Figure 25B:
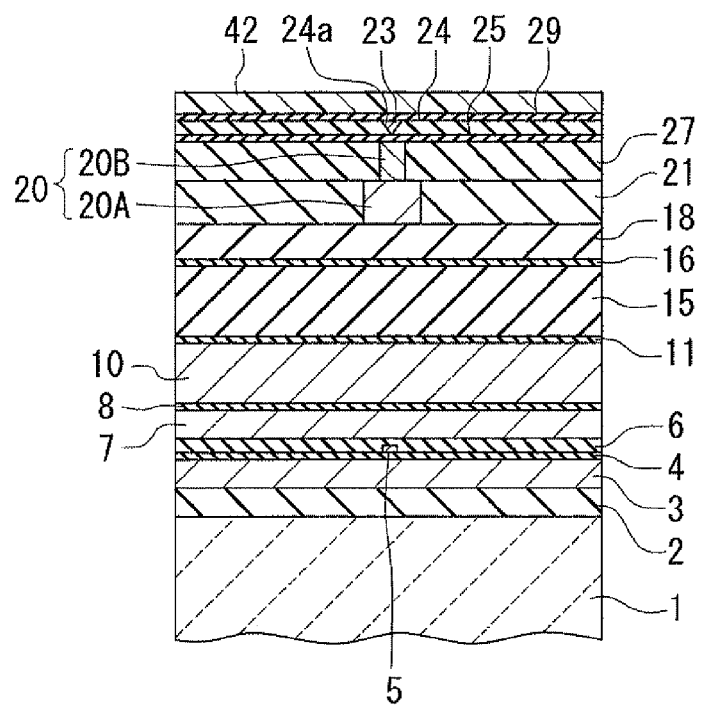

FIG. 25A and FIG. 25B show the next step. In this step, first, a mask 42 is formed on the top surface of the insulating layer 29. The mask 42 has an opening that has a shape corresponding to the planar shape of the convergent lens 30 to be formed later. The mask 42 is made of photoresist, for example. Next, a portion of the insulating layer 29 exposed from the opening of the mask 42 is etched by, for example, RIE, using the mask 42 as the etching mask. The opening 29a is thereby formed in the insulating layer 29. Next, a portion of the top surface of the initial support layer 24P exposed from the opening of the mask 42 is etched by, for example, RIE, using the mask 42 as the etching mask. The groove 24b is thereby formed in the initial support layer 24P. Here, the initial support layer 24P is taper-etched so that the bottom of the groove 24b forms a concave curved surface. The formation of the groove 24b in the initial support layer 24P makes the initial support layer 24P into the support layer 24.

Figure 26A:
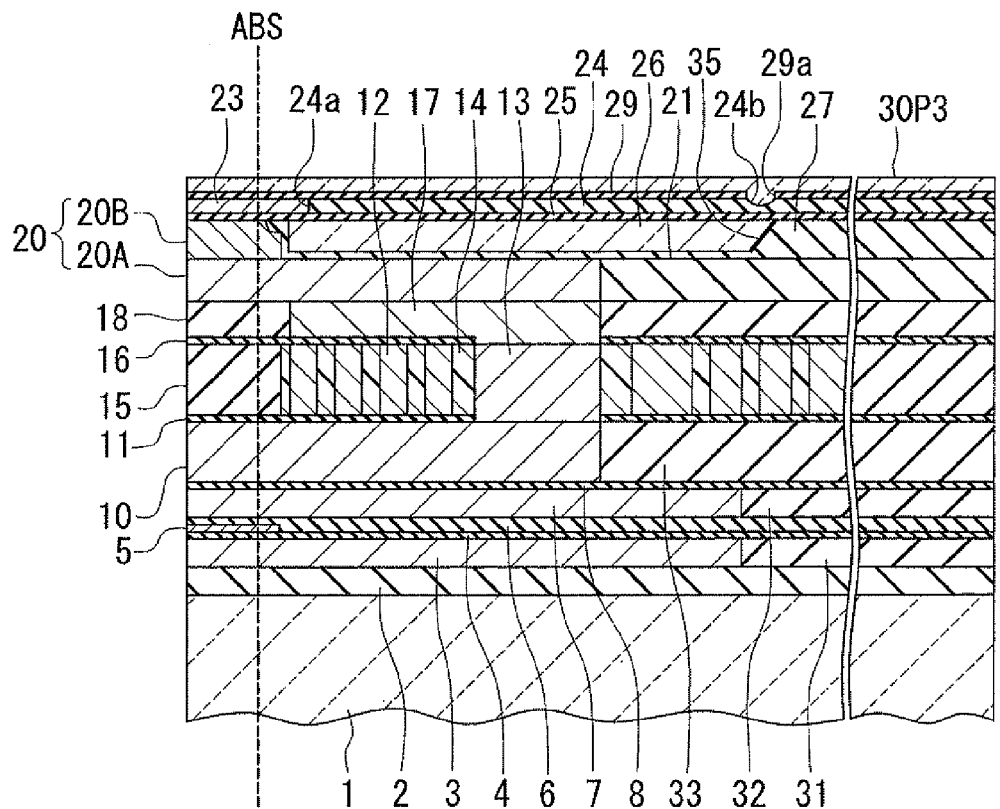
FIG. 26A and FIG. 26B are explanatory diagrams showing a step that follows the step of FIG. 25A and FIG. 25B.
Figure 26B:
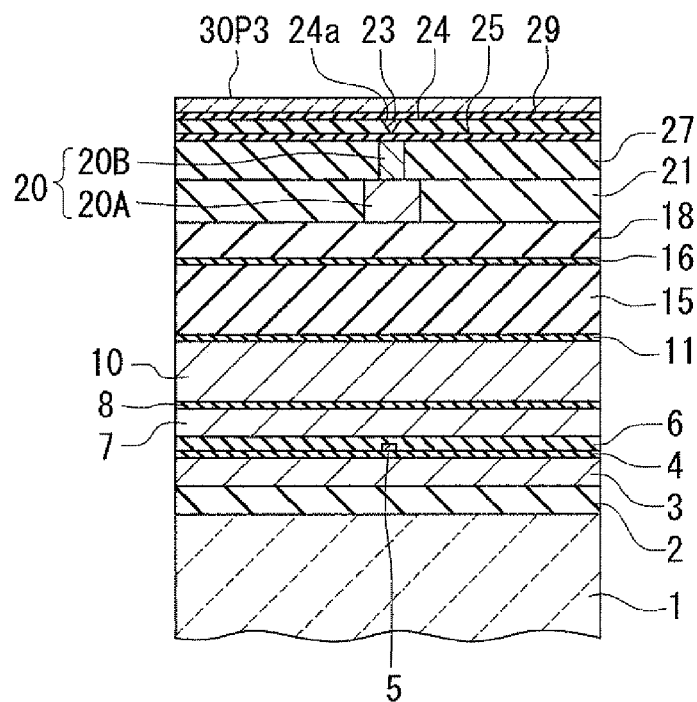

FIG. 26A and FIG. 26B show the next step. In this step, first, the mask 42 is removed. Next, a thermoplastic resin layer 30P3 is formed over the entire top surface of the stack. The thermoplastic resin layer 30P3 is made of a polyimide resin, for example. The thermoplastic resin layer 30P3 is formed to fill the groove 24b and the opening 29a and to have a top surface located at a higher level than the top surface of the insulating layer 29.

Figure 27A:
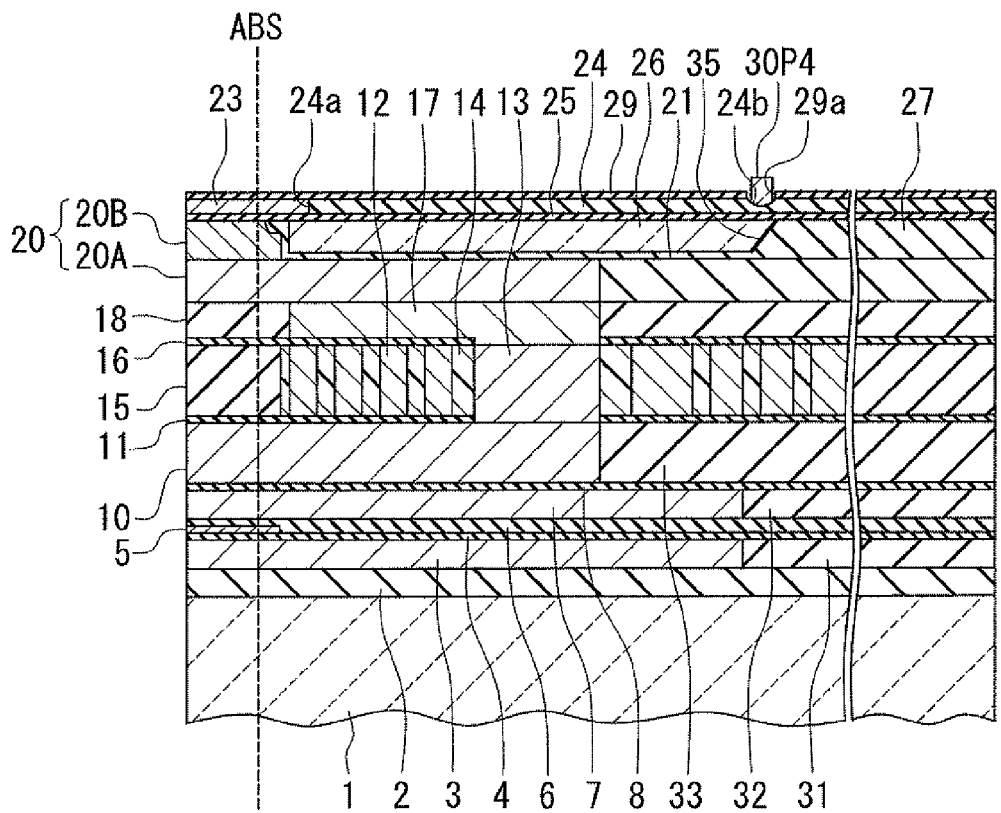
FIG. 27A and FIG. 27B are explanatory diagrams showing a step that follows the step of FIG. 26A and FIG. 26B.
Figure 27B:
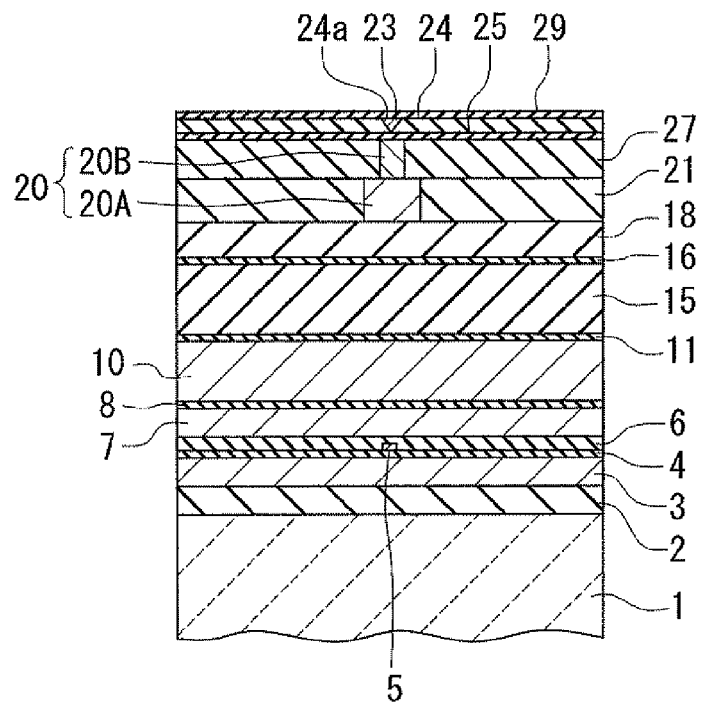

FIG. 27A and FIG. 27B show the next step. In this step, the thermoplastic resin layer 30P3 is selectively etched by RIE, for example. This forms a thermoplastic resin layer 30P4 located on the groove 24b. The thermoplastic resin layer 30P4 is to become the convergent lens 30 later. The thermoplastic resin layer 30P4 has a planar shape smaller than that of the groove 24b and the opening 39a. A part of the thermoplastic resin layer 30P4 is accommodated in the groove 24b and the opening 39a. The top surface of the thermoplastic resin layer 30P4 is located at a higher level than the top surface of the insulating layer 29.

Figure 28A:
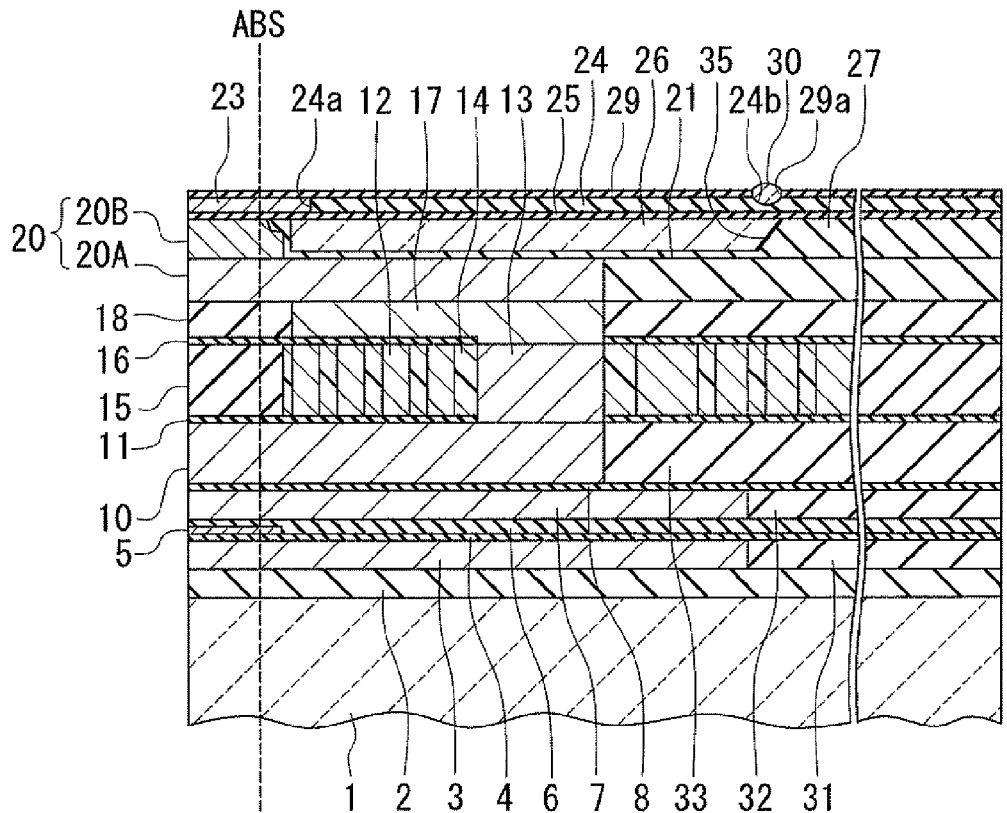
FIG. 28A and FIG. 28B are explanatory diagrams showing a step that follows the step of FIG. 27A and FIG. 27B.
Figure 28B:
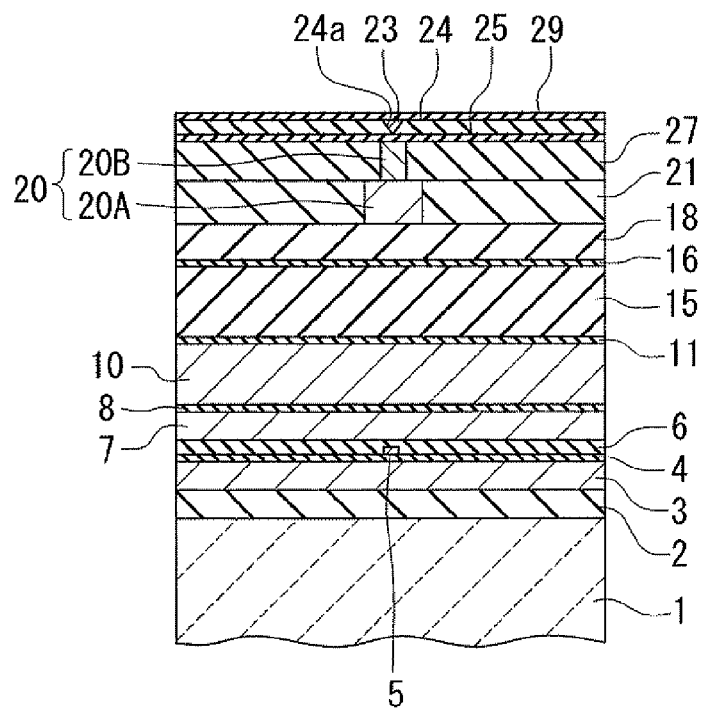

FIG. 28A and FIG. 28B show the next step. In this step, first, the stack is subjected to heat treatment at a temperature of 250° C., for example. The thermoplastic resin layer 30P4 is thereby melted to fill the groove 24b and the opening 29a. Here, the surface of the thermoplastic resin layer 30P4 is shaped into a smooth curved surface by its surface tension. Next, the stack is cooled. This solidifies the melted thermoplastic resin layer 30P4, and thereby makes the thermoplastic resin layer 30P4 into the convergent lens 30. The smooth curved surface of the thermoplastic resin layer 30P4 becomes the top surface of the convergent lens 30. The subsequent steps are the same as in the first embodiment.

The remainder of configuration, function and effects of the present embodiment are similar to those of the first embodiment.

It should be appreciated that the present invention is not limited to the foregoing embodiments, and various modifications may be made thereto. For example, the internal mirror 35 may be replaced with a diffraction grating that diffracts the laser light entering the waveguide 26 from the top surface 26c so as to let the laser light travel through the wave guide 26 toward the medium facing surface 201a.

The laser diode 202, the external mirror 203, the internal mirror 35, the convergent lens 30, and the waveguide 26 may be arranged so that the direction of travel of the laser light emitted from the emission part 222a of the laser diode 202 and the direction of travel of the laser light reflected by the internal mirror 35 are parallel to each other.

In the present invention, the near-field light generating element 23 may have a shape other than the shapes shown in FIG. 6 and FIG. 24.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A heat-assisted magnetic recording head comprising:
a medium facing surface that faces a recording medium;
a magnetic pole that has an end face located in the medium facing surface and produces a recording magnetic field for recording data on the recording medium;
a waveguide that allows light to propagate therethrough;
a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon;
a convergent lens; and
a substrate having a top surface, wherein:
the magnetic pole, the waveguide, the near-field light generating element, and the convergent lens are disposed above the top surface of the substrate;
the near-field light generating element has an outer surface that includes: a first end face that is located in the medium facing surface; a second end face that is farther from the medium facing surface; and a coupling portion that couples the first end face and the second end face to each other, the first end face including the near-field light generating part;
a length of the near-field light generating element in a direction perpendicular to the medium facing surface is greater than a length of the first end face in a direction perpendicular to the top surface of the substrate;
the waveguide has an outer surface including an opposed portion that is opposed to a part of the coupling portion; and
the convergent lens transmits light that is emitted from a light source disposed above the waveguide, so that the light transmitted through the convergent lens is incident on the waveguide.

2. The heat-assisted magnetic recording head according to claim 1, further comprising a support layer that is made of a dielectric material and supports the convergent lens, wherein:
the support layer has a groove that accommodates at least a part of the convergent lens;
the groove has a bottom that forms a concave curved surface; and
the convergent lens has a bottom surface that forms a convex curved surface in contact with the bottom of the groove, and the convergent lens has a refractive index higher than that of the support layer.

3. The heat-assisted magnetic recording head according to claim 1, wherein the convergent lens has a top surface that forms a convex curved surface.

4. The heat-assisted magnetic recording head according to claim 1, further comprising an internal mirror that reflects the light transmitted through the convergent lens so that the reflected light travels through the waveguide toward the medium facing surface.

5. The heat-assisted magnetic recording head according to claim 1, further comprising a laser diode as the light source.

6. The heat-assisted magnetic recording head according to claim 5, wherein the laser diode is of edge-emitting type, the heat-assisted magnetic recording head further comprising an external mirror that reflects the light emitted from the laser diode so that the reflected light is incident on the convergent lens.

7. The heat-assisted magnetic recording head according to claim 5, wherein the laser diode is of surface-emitting type.

8. The heat-assisted magnetic recording head according to claim 1, wherein the convergent lens is made of $Ta_2O_5$.

9. The heat-assisted magnetic recording head according to claim 1, wherein the convergent lens is made of a polyimide resin.

10. A method of manufacturing the heat-assisted magnetic recording head according to claim 1, comprising the steps of:
forming the magnetic pole;
forming the waveguide;
forming the near-field light generating element; and
forming the convergent lens.

11. The method of manufacturing the heat-assisted magnetic recording head according to claim 10, further comprising the step of forming a support layer before the step of forming the convergent lens, the support layer being made of a dielectric material and supporting the convergent lens, wherein:
the support layer has a groove that accommodates at least a part of the convergent lens;
the groove has a bottom that forms a concave curved surface; and the convergent lens has a bottom surface that forms a convex curved surface in contact with the bottom of the groove, and the convergent lens has a refractive index higher than that of the support layer.

12. The method of manufacturing the heat-assisted magnetic recording head according to claim 10, wherein the convergent lens has a top surface that forms a convex curved surface.

13. The method of manufacturing the heat-assisted magnetic recording head according to claim 10, further comprising the step of forming a support layer before the step of forming the convergent lens, the support layer being made of a dielectric material and supporting the convergent lens,
wherein the step of forming the convergent lens includes the steps of:
forming a mask on the support layer, the mask having an opening that has a shape corresponding to a planar shape of the convergent lens to be formed later;
forming a dielectric layer over the support layer and the mask with the mask intact; and
removing the mask and a portion of the dielectric layer formed on the mask, so that a portion of the dielectric layer formed on the support layer becomes the convergent lens.

14. The method of manufacturing the heat-assisted magnetic recording head according to claim 10, further comprising the step of forming a support layer before the step of forming the convergent lens, the support layer being made of a dielectric material and supporting the convergent lens,
wherein the support layer has a groove that accommodates at least a part of the convergent lens, and the step of forming the support layer includes the steps of:
forming an initial support layer that is intended to undergo the formation of the groove therein later to thereby become the support layer;
forming a mask on the initial support layer, the mask having an opening that has a shape corresponding to a planar shape of the convergent lens to be formed later; and
forming the groove in the initial support layer by etching a portion of a top surface of the initial support layer that is exposed from the opening of the mask, so that the initial support layer becomes the support layer,
and wherein the step of forming the convergent lens includes the steps of:
forming a dielectric layer over the groove and the mask with the mask intact; and
removing the mask and a portion of the dielectric layer formed on the mask, so that a portion of the dielectric layer formed on the groove becomes the convergent lens.

15. The method of manufacturing the heat-assisted magnetic recording head according to claim 14, wherein:
the groove has a bottom that forms a concave curved surface; and
the convergent lens has a bottom surface that forms a convex curved surface in contact with the bottom of the groove, and the convergent lens has a refractive index higher than that of the support layer.

16. The method of manufacturing the heat-assisted magnetic recording head according to claim 10, further comprising the step of forming a support layer before the step of forming the convergent lens, the support layer being made of a dielectric material and supporting the convergent lens, wherein:
the support layer has a groove that accommodates at least a part of the convergent lens; and
the step of forming the convergent lens includes the steps of:
forming a thermoplastic resin layer on the groove of the support layer, the thermoplastic resin layer being intended to become the convergent lens later; and
heating the thermoplastic resin layer so that the thermoplastic resin layer melts and thereafter solidifies to become the convergent lens.

17. The method of manufacturing the heat-assisted magnetic recording head according to claim 16, wherein:
the groove has a bottom that forms a concave curved surface; and
the convergent lens has a bottom surface that forms a convex curved surface in contact with the bottom of the groove, and the convergent lens has a refractive index higher than that of the support layer.

18. The method of manufacturing the heat-assisted magnetic recording head according to claim 16, wherein:
the convergent lens has a top surface that forms a convex curved surface; and
in the step of heating the thermoplastic resin layer, the thermoplastic resin layer is melted so that a surface of the thermoplastic resin layer is shaped into a smooth curved surface by surface tension, whereby the top surface of the convergent lens is formed.

19. The method of manufacturing the heat-assisted magnetic recording head according to claim 16, wherein the thermoplastic resin layer is made of a polyimide resin.

20. A heat-assisted magnetic recording head comprising:
a medium facing surface that faces a recording medium;
a magnetic pole that has an end face located in the medium facing surface and produces a recording magnetic field for recording data on the recording medium;
a waveguide that allows light to propagate therethrough;
a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon;
a convergent lens;
a support layer that is made of a dielectric material and supports the convergent lens; and
a substrate having a top surface, wherein:
the magnetic pole, the waveguide, the near-field light generating element, the convergent lens, and the support layer are disposed above the top surface of the substrate;
the support layer has a groove that accommodates at least a part of the convergent lens;
the groove has a bottom that forms a concave curved surface;
the convergent lens has a bottom surface that forms a convex curved surface in contact with the bottom of the groove, and the convergent lens has a refractive index higher than that of the support layer; and
the convergent lens transmits light that is emitted from a light source disposed above the waveguide, so that the light transmitted through the convergent lens is incident on the waveguide.

* * * * *